United States Patent
Tatemura

(10) Patent No.: US 9,835,779 B2
(45) Date of Patent: Dec. 5, 2017

(54) NEAR INFRARED CUTOFF FILTER

(71) Applicant: ASAHI GLASS COMPANY, LIMITED, Tokyo (JP)

(72) Inventor: Mitsuyuki Tatemura, Tokyo (JP)

(73) Assignee: ASAHI GLASS COMPANY, LIMITED, Tokyo (JP)

( * ) Notice: Subject to any disclaimer, the term of this patent is extended or adjusted under 35 U.S.C. 154(b) by 279 days.

(21) Appl. No.: 14/728,115

(22) Filed: Jun. 2, 2015

(65) Prior Publication Data

US 2015/0293284 A1    Oct. 15, 2015

Related U.S. Application Data

(63) Continuation of application No. PCT/JP2013/085274, filed on Dec. 27, 2013.

(30) Foreign Application Priority Data

Dec. 28, 2012   (JP) .................................. 2012-287084

(51) Int. Cl.
*G02B 5/28*        (2006.01)
*H01L 31/0216*     (2014.01)
(Continued)

(52) U.S. Cl.
CPC .............. *G02B 5/282* (2013.01); *G02B 1/113* (2013.01); *G02B 5/283* (2013.01); *G02B 5/285* (2013.01);
(Continued)

(58) Field of Classification Search
CPC ......... G02B 5/281–5/283; G02B 5/208; G02B 1/115; G02B 1/113; G02B 13/14; H01L 27/14625
(Continued)

(56) References Cited

U.S. PATENT DOCUMENTS

2005/0068433 A1   3/2005 Aotsuka
2005/0180010 A1   8/2005 Mukaiyama et al.
(Continued)

FOREIGN PATENT DOCUMENTS

CN   201378210 Y    1/2010
JP   2005-109196    4/2005
(Continued)

OTHER PUBLICATIONS

Tatemura et al., WO 2013/042738, machine translation, Mar. 28, 2013.*
(Continued)

*Primary Examiner* — Ricky Mack
*Assistant Examiner* — Kristina Deherrera
(74) *Attorney, Agent, or Firm* — Oblon, McClelland, Maier & Neustadt, L.L.P.

(57) ABSTRACT

To provide a near infrared cutoff filter capable of suppressing an influence to a captured image when the incidence angle of light to the near infrared cutoff filter is large. The near infrared cutoff filter comprises a substrate to transmit at least light in the visible wavelength region and, on at least one side of the substrate, an infrared reflective layer constituted by a layered film having a high refractive index film H and a low refractive index film L repeatedly laminated, or a layered film having a high refractive index film H, an intermediate refractive index film M and a low refractive index film L' repeatedly laminated, and has light transmittance characteristics such that the difference between the maximum value and the minimum value among the decrease rates in average transmittance in region R, region G and region B, is at most 0.05.

17 Claims, 7 Drawing Sheets

(51) Int. Cl.
  *H01L 27/146* (2006.01)
  *G02B 1/113* (2015.01)
  *G02B 1/11* (2015.01)
(52) U.S. Cl.
  CPC ........ *G02B 5/288* (2013.01); *H01L 27/14625* (2013.01); *H01L 31/02162* (2013.01); *G02B 1/11* (2013.01)
(58) Field of Classification Search
  USPC ............... 359/354–359, 726–732, 584–589; 378/34–35; 101/450.1–473; 430/302–305
  See application file for complete search history.

(56) References Cited

U.S. PATENT DOCUMENTS

| | | |
|---|---|---|
| 2005/0265150 A1 | 12/2005 | Hirayama et al. |
| 2007/0127126 A1 | 6/2007 | Terada |
| 2008/0013178 A1* | 1/2008 | Terada .................. G02B 5/282 359/586 |
| 2013/0135714 A1* | 5/2013 | Kondo .................. C03C 3/247 359/359 |
| 2014/0139912 A1 | 5/2014 | Osawa et al. |
| 2015/0085354 A1 | 3/2015 | Tatemura |
| 2015/0160386 A1 | 6/2015 | Takemura |

FOREIGN PATENT DOCUMENTS

| | | |
|---|---|---|
| JP | 2005-234038 | 9/2005 |
| JP | 2006-012371 | 1/2006 |
| JP | 2007-183525 | 7/2007 |
| WO | WO 2013/042738 | 3/2013 |

OTHER PUBLICATIONS

International Search Report dated Apr. 8, 2014, in PCT/JP2013/085274 filed Dec. 27, 2013.

* cited by examiner

NEAR INFRARED CUTOFF FILTER

TECHNICAL FIELD

The present invention relates to a near infrared cutoff filter, particularly to a near infrared cutoff filter provided with a dielectric multi-layer formed on a substrate.

BACKGROUND ART

In digital cameras, digital videos, etc., a CCD (Charge Coupled Device) image sensor, a CMSO (Complementary Metal Oxide Semiconductor) image sensor or the like (hereinafter referred to as a solid state imaging sensor) is used. Such a solid state imaging sensor has a sensitivity characteristic to light such that its sensitivity to infrared light is strong as compared with the spectral sensitivity of human. Therefore, in a digital camera, a digital video or the like, spectral correction is usually made by means of a near infrared cutoff filter.

As such a near infrared cutoff filter, a near infrared-absorbing type colored glass filter of e.g. a fluorophosphate glass containing $Cu^{2+}$ ions as a colorant component, has been used. However, by the colored glass filter alone, it is not possible to sufficiently cut off light in the near infrared region, and therefore, at present, a dielectric multi-layer having a property to cut off light in the near infrared region is being studied.

The dielectric multi-layer is one which is formed by alternately laminating a thin film made of a high refractive index dielectric (e.g. $TiO_2$) and a thin film made of a low refractive index dielectric (e.g. $SiO_2$), on a transparent substrate. And, the near infrared cutoff filter using such a dielectric multi-layer is designed to utilize the interference effect by the multi-layer to reflect infrared light thereby to suppress transmission of the infrared light.

The near infrared cutoff filter using a dielectric multi-layer is known to have high incidence angle dependency in its spectral characteristics. A near infrared cutoff filter having the incidence angle dependency reduced, has been proposed wherein in the spectral characteristics of the near infrared cutoff filter, when the wavelength at which the transmittance in a transition region from a short wavelength side transmission band region to a long wavelength side reflection band region is 50%, is taken as a half-value wavelength, the shift amount (variation) between the half-value wavelength at an incidence angle of 0° and the half-value wavelength at an incidence angle of 25° is small (see e.g. Patent Document 1).

PRIOR ART DOCUMENT

Patent Document

Patent Document 1: JP-A-2007-183525

DISCLOSURE OF INVENTION

Technical Problem

In recent years, due to a demand for a thin-walled structure for electronic equipment such as digital cameras, cell phones, smartphones, etc., a lower profile is required for an imaging device to be built in such electronic equipment, and the respective distances among an optical lens, a near infrared cutoff filter and a solid state imaging sensor tend to be very small. Light is thereby likely to enter into the solid state imaging sensor from wider angles.

Further, a back-illuminated CMOS sensor has recently been used as a solid state imaging sensor. The back-illuminated CMOS sensor has a structure wherein light passed through a color filter will enter into a photo diode without via a wiring layer, and the amount of incident light is large, whereby highly sensitive imaging is possible. On the other hand, since there is no deficit of light due to the wiring layer, light entering from inclined angles into the photo diode increases.

Thus, to the solid state imaging sensor, light tends to enter at wider angles as compared heretofore, and a near infrared cutoff filter having light transmittance characteristics capable of coping with large incidence angles is now desired.

The present inventors have investigated the relation between the spectral characteristics and the incidence angles of light with respect to a near infrared cutoff filter using a dielectric multi-layer and, as a result, have found that in a case where the incidence angle is large as exceeding 30°, a local decrease in transmittance in the visible wavelength region occurs which is not observed in a case where the incidence angle is 30° or smaller. The local decrease in transmittance in the visible wavelength region is expected to give an adverse effect to a color tone of a captured image.

The near infrared cutoff filter disclosed in Patent Document 1 is capable of suppressing the shift amount of the half-value wavelength when the incidence angle has changed from 0 to 25°, but no consideration is made with respect to the local decrease in transmittance in the visible wavelength region which occurs when the incidence angle becomes large. Further, the shift of the half-value wavelength or the local decrease in transmittance in the visible wavelength region tends to be more remarkable as the incidence angle increases, and therefore, even if it is possible to suppress the incidence angle dependency at an incidence angle of 25°, if the incidence angle exceeds 25°, it may not be possible to do so.

Heretofore, in the relation between the spectral characteristics and the incidence angle of light with respect to a near infrared cutoff filter using a dielectric multi-layer, it has been taken for granted that the incidence angle dependency is suppressed by suppressing the shift amount of the half-value wavelength. However, as mentioned above, the local decrease in transmittance in the visible wavelength region disturbs the balance of color of light passing through the near infrared cutoff filter to cause a difference in the color tone of the captured image as visually observed, which is a phenomenon remarkably observed when the incidence angle becomes very large and with respect to which no consideration has heretofore been made.

The present invention has been made in view of the above problem and has an object to provide a near infrared cutoff filter capable of suppressing an influence to a captured image when the incidence angle of light to the near infrared cutoff filter is large.

Solution to Problem

The present invention has the following constructions as its gist.
(1) A near infrared cutoff filter which comprises a substrate to transmit at least light in the visible wavelength region and, on at least one side of the substrate, an infrared reflective layer constituted by a layered film having a high refractive index film H and a low refractive index film L (made of a constituent material having a refractive index at a wavelength of 500 nm smaller than a constituent material for the high refractive index film H) repeatedly laminated, or a layered film having a high refractive index film H, an intermediate refractive index film M (made of a constituent material having a refractive index at a wavelength of 500 nm smaller than a constituent material for the high refractive index film H) and a low refractive index film L' (made of a constituent material having a refractive index at a wavelength of 500 nm smaller than a constituent material for the intermediate refractive index film M) repeatedly laminated, and which has light transmittance characteristics such that when the decrease rates in average transmittance in region R, region G and region B are calculated by the following formulae (1) to (3), respectively, the difference between the maximum value and the minimum value among them is at most 0.05:

$$(T(R0)-T(R40))/T(R0) \quad (1)$$

$$(T(G0)-T(G40))/T(G0) \quad (2)$$

$$(T(B0)-T(B40))/T(B0) \quad (3)$$

where the wavelength band of from 600 to 620 nm is designated as region R, the wavelength band of from 500 to 560 nm is designated as region G, and the wavelength band of from 440 to 480 nm is designated as region B, the respective average transmittances in regions R, G and B under vertical incidence condition are designated as T(R0), T(G0) and T(B0), respectively, and the respective average transmittances in regions R, G and B under 40° incidence condition are designated as T(R40), T(G40) and T(B40), respectively.

(2) A near infrared cutoff filter which comprises a substrate to transmit at least light in the visible wavelength region and, on at least one side of the substrate, an infrared reflective layer constituted by a layered film having a high refractive index film H and a low refractive index film L repeatedly laminated, and which has light transmittance characteristics such that when the decrease rates in average transmittance in region R, region G and region B are calculated by the following formulae (1) to (3), respectively, the difference between the maximum value and the minimum value among them is at most 0.04:

$$(T(R0)-T(R40))/T(R0) \quad (1)$$

$$(T(G0)-T(G40))/T(G0) \quad (2)$$

$$(T(B0)-T(B40))/T(B0) \quad (3)$$

where the wavelength band of from 600 to 620 nm is designated as region R, the wavelength band of from 500 to 560 nm is designated as region G, and the wavelength band of from 440 to 480 nm is designated as region B, the respective average transmittances in regions R, G and B under vertical incidence condition are designated as T(R0), T(G0) and T(B0), respectively, and the respective average transmittances in regions R, G and B under 40° incidence condition are designated as T(R40), T(G40) and T(B40), respectively.

(3) A near infrared cutoff filter which comprises a substrate to transmit at least light in the visible wavelength region and, on at least one side of the substrate, an infrared reflective layer constituted by a layered film having a high refractive index film H and a low refractive index film L (made of a constituent material having a refractive index at a wavelength of 500 nm smaller than a constituent material for the high refractive index film H) repeatedly laminated, or a layered film having a high refractive index film H, an intermediate refractive index film M (made of a constituent material having a refractive index at a wavelength of 500 nm smaller than a constituent material for the high refractive index film H) and a low refractive index film L' (made of a constituent material having a refractive index at a wavelength of 500 nm smaller than a constituent material for the intermediate refractive index film M) repeatedly laminated, and which has light transmittance characteristics such that each of the decrease rates in average transmittance in region G and region B calculated by the following formulae (4) and (5), respectively, is at most 0.09:

$$(T(G0)-T(G45))/T(G0) \quad (4)$$

$$(T(B0)-T(B45))/T(B0) \quad (5)$$

where the wavelength band of from 500 to 560 nm is designated as region G, and the wavelength band of from 440 to 480 nm is designated as region B, the respective average transmittances in regions G and B under vertical incidence condition are designated as T(G0) and T(B0), respectively, and the respective average transmittances in regions G and B under 45° incidence condition are designated as T(G45) and T(B45), respectively.

(4) A near infrared cutoff filter which comprises a substrate to transmit at least light in the visible wavelength region and, on at least one side of the substrate, an infrared reflective layer constituted by a layered film having a high refractive index film H and a low refractive index film L repeatedly laminated, and which has light transmittance characteristics such that each of the decrease rates in average transmittance in region G and region B calculated by the following formulae (4) and (5), respectively, is at most 0.09:

$$(T(G0)-T(G45))/T(G0) \quad (4)$$

$$(T(B0)-T(B45))/T(B0) \quad (5)$$

where the wavelength band of from 500 to 560 nm is designated as region G, and the wavelength band of from 440 to 480 nm is designated as region B, the respective average transmittances in regions G and B under vertical incidence condition are designated as T(G0) and T(B0), respectively, and the respective average transmittances in regions G and B under 45° incidence condition are designated as T(G45) and T(B45), respectively.

(5) The near infrared cutoff filter according to the above (1), wherein the light transmittance characteristics of the near infrared cutoff filter are such that each of the decrease rates calculated by the formulae (1) to (3) is at most 0.05.

(6) The near infrared cutoff filter according to any one of the above (1) to (5), wherein the substrate contains a material to absorb near infrared rays.

(7) The near infrared cutoff filter according to any one of the above (1) to (6), wherein the infrared reflective layer is at most 50 layers.

(8) The near infrared cutoff filter according to any one of the above (1) to (7), wherein the light transmittance characteristics of the near infrared cutoff filter are such that each of the minimum values of light transmittances in the wavelength bands in regions G and B under 40° incidence condition is at least 85%.

(9) The near infrared cutoff filter according to any one of the above (1) to (8), wherein the light transmittance characteristics of the near infrared cutoff filter are such that the light transmittance at a wavelength of 1,200 nm under 40° incidence condition is at most 10%.

(10) The near infrared cutoff filter according to any one of the above (1) to (9), wherein the infrared reflective layer has a plurality of layered films represented by $(HL)^n$ (where H is a high refractive index film, L is a low refractive index film, n is a natural number of at least 2, and $^n$ means a structure wherein (HL) is repeated n times), and the light transmittance characteristics of the plurality of layered films are such that the maximum value of the light transmittance in the wavelength band of from 950 to 1,150 nm under vertical incidence condition is at most 10%.

(11) The near infrared cutoff filter according to any one of the above (1), (3), (5) to (9), wherein the infrared reflective layer has a plurality of layered films represented by $(L'MH)^n$ (where H is a high refractive index film, M is an intermediate refractive index film, L' is a low refractive index film, n is a natural number of at least 2, and $^n$ means a structure wherein (L'MH) is repeated n times), and the light transmittance characteristics of the plurality of layered films are such that the maximum value of the light transmittance in the wavelength band of from 950 to 1,150 nm under vertical incidence condition is at most 10%.

(12) The near infrared cutoff filter according to any one of the above (1) to (11), wherein the substrate is made of fluorophosphate glass or phosphate glass.

(13) The near infrared cutoff filter according to any one of the above (1), (3), (5) to (12), wherein the high refractive index film contains, as a constituent material, at least one member selected from the group consisting of $TiO_2$, $Ta_2O_5$, $Nb_2O_5$ and composite oxides thereof, the intermediate refractive index film contains, as a constituent material, at least one member selected from the group consisting of $Al_2O_3$, $Y_2O_3$ and composite oxides thereof, and the low refractive index film contains, as a constituent material, at least one member selected from the group consisting of $SiO_2$, $MgF_2$ and composite oxides thereof.

(14) The near infrared cutoff filter according to any one of the above (1) to (12), wherein the high refractive index film contains, as a constituent material, at least one member selected from the group consisting of $TiO_2$, $Ta_2O_5$, $Nb_2O_5$ and composite oxides thereof, and the low refractive index film contains, as a constituent material, at least one member selected from the group consisting of $SiO_2$, $MgF_2$ and composite oxides thereof.

(15) The near infrared cutoff filter according to any one of the above (1) to (14), which has the infrared reflective layer on the front side of the substrate, and an antireflection film or the infrared reflective layer on the rear side of the substrate.

Advantageous Effect of Invention

According to the present invention, it is possible to provide a near infrared cutoff filter capable of suppressing an influence to a captured image when the incidence angle of light to the near infrared cutoff filter is large.

DESCRIPTION OF EMBODIMENTS

First Embodiment

Figure 1A:
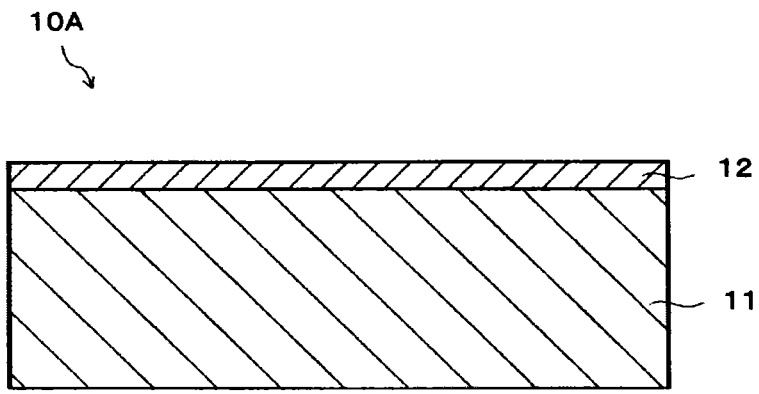
FIGS. 1A, 1B and 1C show cross-sectional views of near infrared cutoff filters according to the first to third embodiments of the present invention.
Figure 1B:
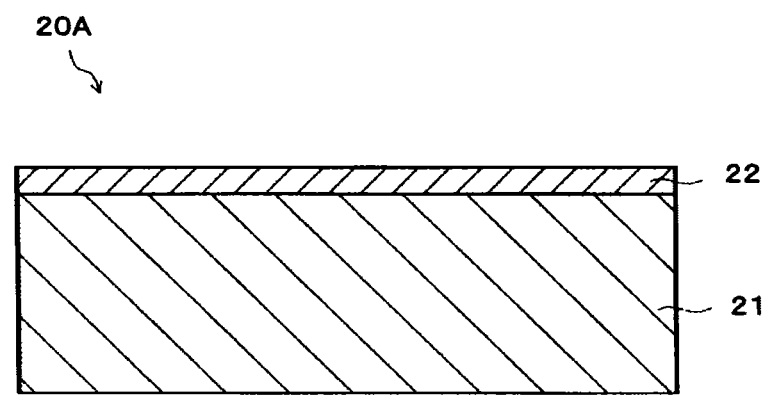
Figure 1C:
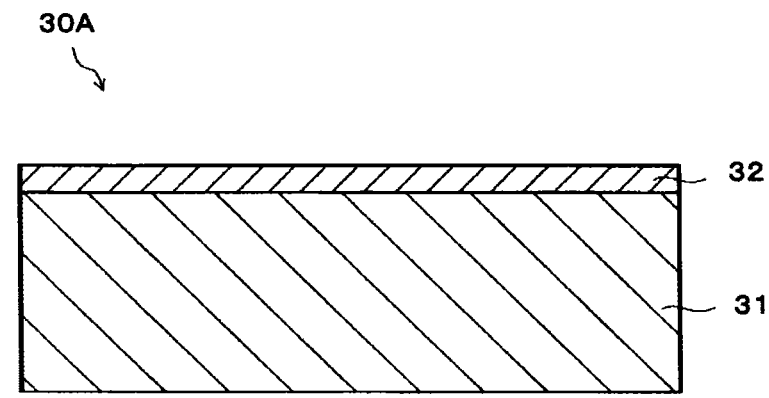

FIG. 1(A) is a cross-sectional view of a near infrared cutoff filter 10A (hereinafter sometimes referred to as IRCF 10) according to the first embodiment of the present invention. As shown in FIG. 1(A), IRCF 10 comprises a substrate 11 and an infrared reflective layer 12 formed on at least one side of the substrate 11. Here, in IRCF 10 according to the first embodiment, the infrared reflective layer 12 is formed on one side of the substrate 11.

(Substrate 11)

The material for the substrate 11 is preferably one which transmits at least light in the visible wavelength region and which absorbs light in the near infrared wavelength region. By using the substrate 11 which absorbs light in the near infrared wavelength region, it is possible to obtain an image quality close to spectral sensitivity characteristics of human.

Here, a transparent substrate 11 which absorbs light in the near infrared wavelength region, may, for example, be an absorption glass containing $Cu^{2+}$ (copper ions) in fluorophosphate glass or phosphate glass.

Otherwise, it is possible to use one containing an absorber to absorb near infrared light in a resin material. Such an absorber may, for example, be a dye, a pigment or a metal complex compound, and specifically, a phthalocyanine compound, a naphthalocyanine compound or a dithiol metal complex compound, may be mentioned.

Further, it is possible to use, as the substrate 11, a glass having a resin layer containing a colorant to absorb near infrared light, laminated on one side of a glass substrate which transmits light in the visible wavelength region.

The shape of the substrate 11 may be a flat or curved plate form. Otherwise, the substrate 11 may be an optical lens having at least one optical surface concaved or convexed. In such a case, the infrared reflective layer 12 is formed on the optical surface of the optical lens.

(Structure of Infrared Reflective Layer 12)

Figure 2A:
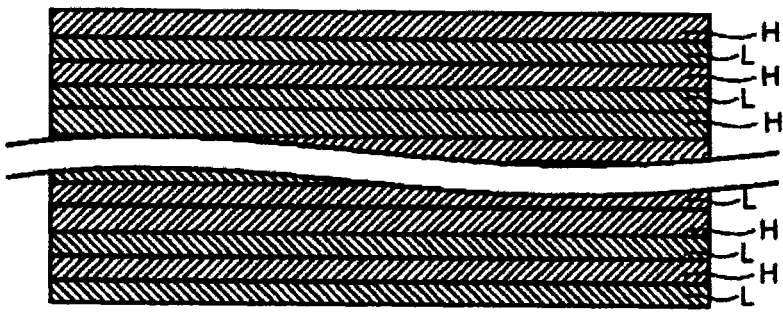
FIGS. 2A and 2B show cross-sectional views of infrared reflective layers of the present invention.
Figure 2B:
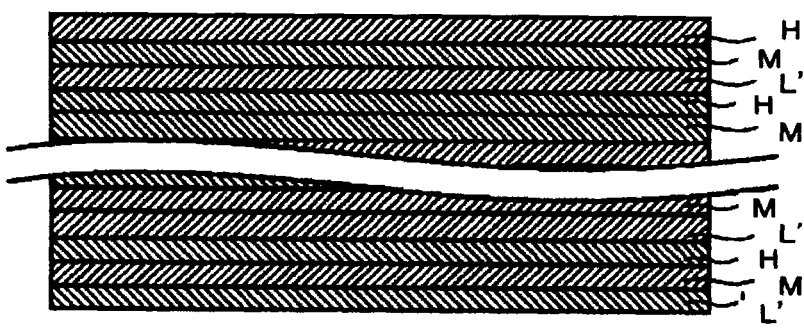

As shown in FIGS. 2(A) and (B), the infrared reflective layer 12A is constituted by a layered film having a high refractive index film H and a low refractive index film L (made of a constituent material having a refractive index at a wavelength of 500 nm smaller than a constituent material for the high refractive index film H) repeatedly laminated, and the infrared reflective layer 12B is constituted by a layered film having a high refractive index film H, an intermediate refractive index film M (made of a constituent material having a refractive index at a wavelength of 500 nm smaller than a constituent material for the high refractive index film H) and a low refractive index film L' (made of a constituent material having a refractive index at a wavelength of 500 nm smaller than a constituent material for the intermediate refractive index film M) repeatedly laminated.

Here, in this specification, the refractive index means a refractive index to light with a wavelength of 500 nm.

The constituent material for the high refractive index film preferably has a refractive index of at least 2, more preferably from 2.2 to 2.7. Such a constituent material may, for example, be $TiO_2$, $Nb_2O_5$ (refractive index: 2.38), $Ta_2O_5$ or a composite oxide thereof.

The constituent material for the intermediate refractive index film preferably has a refractive index of more than 1.6 and less than 2, more preferably from 1.62 to 1.92. Such a constituent material may, for example, be $Al_2O_3$, $Y_2O_3$ (refractive index: 1.81) or a composite oxide thereof, or a mixed film (refractive index: 1.67) of $Al_2O_3$ and $ZrO_2$. Otherwise, the intermediate refractive index film may be substituted by an equivalent film having a high refractive index film and a low refractive index film combined. Further, although departing from the above refractive index ranges, so long as $TiO_2$ or the like having a refractive index of at least 2.3 is used as the high refractive index film, it is possible to constitute the infrared reflective film by using, as the intermediate refractive index film, $Ta_2O_5$ having a refractive index of about 2.18. This may not bring about a specific merit from the viewpoint of optical design, but may in some cases be selected for use as it brings about excellent physical durability or thermal stability.

The constituent material for the low refractive index film preferably has a refractive index of at most 1.6, more preferably from 1.36 to 1.50. Such a constituent material may, for example, be $SiO_2$, $MgF_2$ or a composite oxide thereof.

An additive to adjust the refractive index may be incorporated to the high refractive index film, the intermediate refractive index film or the low refractive index film. Such an additive may, for example, be $SiO_2$, $Al_2O_3$, $CeO_2$, $FeO_2$, $HfO_2$, $In_2O_3$, $MgF_2$, $Nb_2O_5$, $SnO_2$, $Ta_2O_5$, $TiO_2$, $Y_2O_3$, $ZnO$, $ZrO_2$, $NiO$, ITO (Indium Tin Oxide), ATO (Antimony doped Tin Oxide) or $MgO$.

The total number of layers of the high refractive index films and low refractive index films constituting the infrared reflective layer 12A, or the total number of layers of the high refractive index films, intermediate refractive index films and low refractive index films constituting the infrared reflective layer 12B, is preferably at most 50 layers. By such a construction, the productivity of the near infrared cutoff filter can be made high. It is more preferably at most 45 layers, particularly preferably from 15 to 40 layers.

The total thickness of layers of the high refractive index films and low refractive index films constituting the infrared reflective layer 12A, or the total thickness of layers of the high refractive index films, intermediate refractive index films and low refractive index films constituting the infrared reflective layer 12B, is preferably at most 6.0 μm. By such a construction, in a case where an infrared reflective layer 12 is formed on one side of the substrate 11, it is possible to prevent warpage of the near infrared cutoff filter to be caused by an internal stress of the infrared reflective layer 12. It is more preferably at most 5.5 μm, particularly preferably from 2.0 to 3.8 μm.

Otherwise, the infrared reflective layer 12 may be provided dividedly on one side and the other side of the substrate 11. In such a case, it is possible to prevent warpage of the near infrared cutoff filter by balancing out internal stresses of dielectric multi-layers between one side and the other side of the substrate 11.

The high refractive index films and low refractive index films constituting the infrared reflective layer 12A, and the high refractive index films, intermediate refractive index films and low refractive index films constituting the infrared reflective layer 12B, may be formed by a sputtering method, a vacuum vapor deposition method, an ion beam method, an ion plating method or a CVD method, but it is particularly preferred that they are formed by a sputtering method, a vacuum vapor deposition method or an ion beam method. The infrared reflective layer 12A or 12B is one to form a wavelength band to be utilized for light-receiving of a solid state imaging sensor, and high precision is required for the reflection conditions in the respective wavelength bands. In order to attain the requirement, the precision in thickness of the high refractive index film and low refractive index film, and the high refractive index film, intermediate refractive index film and low refractive index film, becomes important. A sputtering method, a vacuum vapor deposition method or an ion beam method, is preferred, since it is excellent in the control of film thickness at the time of forming a thin film.

On the substrate 11, in addition to the infrared reflective layer 12, a single layer film or multi-layer film having $MgF_2$, a composite oxide of alumina and zirconium oxide, or a lanthanum titanate ($La_2Ti_2O_7$), may be formed as an adhesion-reinforcing layer in order to increase adhesion between the substrate 11 and the infrared reflective layer 12.

Further, in order to impart electrical conductivity to the near infrared cutoff filter, an antistatic layer made of a thin film of e.g. ITO may be formed on the surface side (air side) of the infrared reflective layer 12.

Further, in order to prevent deposition of a foreign matter such as dust on the near infrared cutoff filter, a foreign matter deposition-preventing layer made of a thin film containing a fluorine component, may be formed on the surface side (air side) of the infrared reflective layer 12.

(Light Transmittance Characteristics of Near Infrared Cutoff Filter)

Now, the light transmittance characteristics of the near infrared cutoff filter will be described. Here, IRCF 10 according to the first embodiment has a characteristic such that the substrate 11 absorbs wavelengths of near infrared light. Therefore, the light transmittance characteristics of the near infrared cutoff filter mean light transmittance characteristics of IRCF 10 obtainable by both of the substrate 11 and the infrared reflective layer 12.

Further, in the present invention, in a case where the infrared reflective layer is formed only on one side of the substrate, an antireflection film is formed on the other side of the substrate, whereby it is considered that there is no substantial loss of light by reflection at the interface between the substrate and the air layer.

In a case where IRCF 10 is a near infrared cutoff filter having an infrared reflective layer constituted by a layered film having a high refractive index film H and a low refractive index film L (made of a constituent material having a refractive index at a wavelength of 500 nm smaller than a constituent material for the high refractive index film H) repeatedly laminated, or a layered film having a high refractive index film H, an intermediate refractive index film M (made of a constituent material having a refractive index at a wavelength of 500 nm smaller than a constituent material for the high refractive index film H) and a low refractive index film L' (made of a constituent material having a refractive index at a wavelength of 500 nm smaller than a constituent material for the intermediate refractive index film M) repeatedly laminated, IRCF 10 has light transmittance characteristics such that when the decrease rates in average transmittance in region R, region G and region B are calculated by the following formulae (1) to (3), respectively, the difference between the maximum value and the minimum value among them is at most 0.05:

$$(T(R0)-T(R40))/T(R0) \quad (1)$$

$$(T(G0)-T(G40))/T(G0) \quad (2)$$

$$(T(B0)-T(B40))/T(B0) \quad (3)$$

where the wavelength band of from 600 to 620 nm is designated as region R, the wavelength band of from 500 to 560 nm is designated as region G, and the wavelength band of from 440 to 480 nm is designated as region B, the respective average transmittances in regions R, G and B under vertical incidence condition are designated as $T(R0)$, $T(G0)$ and $T(B0)$, respectively, and the respective average transmittances in regions R, G and B under 40° incidence condition are designated as $T(R40)$, $T(G40)$ and $T(B40)$, respectively.

The reason for the light transmittance characteristics of IRCF 10 being as defined above will be described below.

Figure 3:
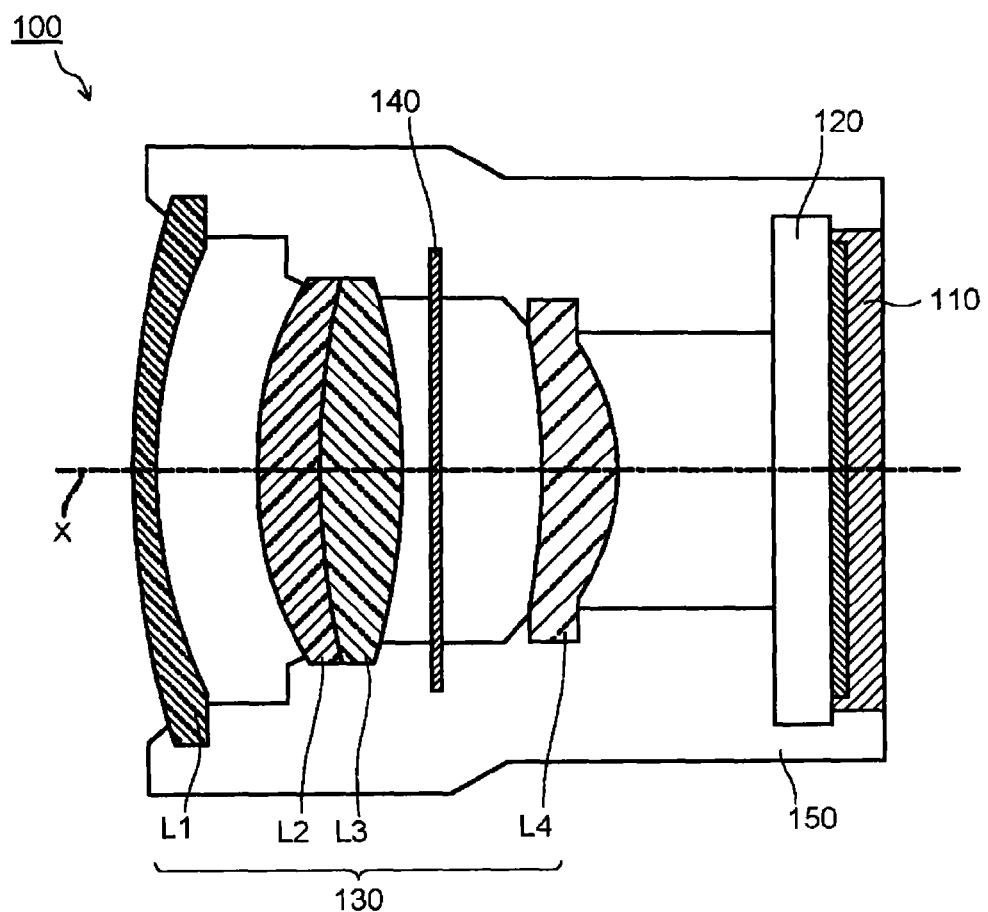
FIG. 3 is a cross-sectional view illustrating a basic construction of an imaging device.

As shown in FIG. 3, the basic construction of an imaging device comprises optical lenses (L1 to L4) into which light enters, a near infrared cutoff filter 140 to cutoff light having near infrared wavelengths from the entered light and a solid state imaging sensor 110 to receive the light and conduct photoelectric conversion. Further, in fact, a low-pass filter to suppress moire, a cover glass to prevent deposition of a foreign matter on the solid state imaging sensor, etc. are also provided, but they are omitted here.

Next, the basic construction of the solid state imaging sensor will be described. Light entered into the solid state imaging sensor will pass through a micro-lens, a color filter and a wiring layer and is received by a photo diode. The color filter is one to let only light with desired wavelengths from the received light, enter into the photo diode, and is made of e.g. a resin film containing a pigment or dye using an organic substance. Further, RGB color filters are arranged in a suitable pattern (e.g. in a Bayer array) on a flat surface.

The light entered into the photo diode is photoelectrically converted, whereupon the respective color signals are taken out, and the color signals are subjected to arithmetic processing, whereby color image data are formed, and a captured image is obtainable.

In the above construction of the solid state imaging sensor, how to set the light transmittance characteristics of RGB color filters (transmittances and wavelength bands of light passing therethrough) and relative intensities of the respective color signals, is very important for deciding the color representation of a captured image. Therefore, the light transmittance characteristics of the respective color filters, and the arithmetic processing method for the color signals, are set individually depending upon the particular imaging device.

The light transmittance characteristics of the respective color filters, and the arithmetic processing method for the color signals, are basically set so that the desired color representation is obtainable to light vertically entering into the solid state imaging sensor.

Therefore, when light has entered obliquely to the solid state imaging sensor, if the balance of light intensities of the respective color (R, G and B) wavelength bands is substantially different from the case where light has entered vertically, the captured image may not exhibit the intended color representation.

In a case where the near infrared cutoff filter of the present invention is provided with an infrared reflective layer constituted by a layered film having the high refractive index film H and the low refractive index film L (made of a constituent material having a refractive index at a wavelength of 500 nm smaller than a constituent material for the high refractive index film H) repeatedly laminated, or a layered film having the high refractive index film H, the intermediate refractive index film M and the low refractive index film L' repeatedly laminated, it has light transmittance characteristics such that when the decrease rates in average transmittance in region R, region G and region B are calculated by $(T(R0)-T(R40))/T(R0)$, $(T(G0)-T(G40))/T(G0)$, $(T(B0)-T(B40))/T(B0)$, respectively, the difference between the maximum value and the minimum value among them is at most 0.05. Further, in a case where the near infrared cutoff filter of the present invention is provided with an infrared reflective layer constituted by a layered film having the high refractive index film H and the low refractive index film L repeatedly laminated, it has light transmittance characteristics such that the difference between the maximum value and the minimum value among the decrease rates in average transmittance is at most 0.04.

Here, the decrease rates are calculated independently with respect to region R, region G and region B, respectively, whereupon the difference between the maximum value and the minimum value among the three decrease rates, is calculated. By taking such a construction, in the light transmittance characteristics of IRCF 10, variation in the decrease rate is small among the respective wavelength bands of region R, region G and region B when light has entered obliquely into the near infrared cutoff filter, and the balance of RGB colors will not be disrupted as between a case where light has entered vertically and a case where light has entered obliquely. Accordingly, it becomes possible to obtain a captured image with a desired color representation by a solid state imaging sensor.

In a case where IRCF 10 is a near infrared cutoff filter provided with an infrared reflective layer constituted by a layered film having the high refractive index film H and the low refractive index film L (made of a constituent material having a refractive index at a wavelength of 500 nm smaller than a constituent material for the high refractive index film H) repeatedly laminated, or a layered film having the high refractive index film H, the intermediate refractive index film M and the low refractive index film L' repeatedly laminated, if its light transmittance characteristics are such that the difference between the maximum value and the minimum value among the decrease rates in average transmittance exceeds 0.05, the difference in the decrease rate in average transmittance among the RGB wavelength bands becomes large between a case where light to pass through IRCF 10 has entered vertically and a case where it has entered at an incident angle of 40°, and thus, it becomes difficult to obtain a captured image with a desired color representation by a solid state imaging sensor. Further, in a case where IRCF 10 is a near infrared cutoff filter provided with an infrared reflective layer constituted by a layered film having the high refractive index film H and the low refractive index film L repeatedly laminated, if its light transmittance characteristics are such that the difference between the maximum value and the minimum value among the decrease rates in average transmittance exceeds 0.04, the difference in the decrease rate in average transmittance among the RGB wavelength bands becomes large between a case where light to pass through IRCF 10 has entered vertically and a case where it has entered at an incident angle of 40°, and thus, it becomes difficult to obtain a captured image with a desired color representation by a solid state imaging sensor. The above difference between the maximum value and the minimum value in the decrease rate in average transmittance is preferably at most 0.03, more preferably at most 0.02.

The light transmittance characteristics of IRCF 10 are preferably such that each of the minimum values in light transmittance in the wavelength bands of region G (wavelength band of from 500 to 560 nm) and region B (wavelength band of from 440 to 480 nm) under 40° incidence condition, is at least 85%.

In the light transmittance characteristics of an infrared reflective layer using an optical multi-layer film, the shift phenomenon of the light transmittance characteristics towards the short wavelength side of region R, along with oblique incidence of light, has heretofore been known. Therefore, in consideration of the shift of the light transmittance characteristics, correction treatment by an image treating device has been studied. However, the shift of the light transmittance characteristics in region G and region B along with oblique incidence of light, appears as a decrease in transmittance at an unspecific position depending upon the film construction or incidence angle, and therefore, correction treatment by an image treating device is impossible.

By setting the light transmittance characteristics of IRCF 10 so that the minimum value in transmittance in the wavelength bands of region G and region B under 40° incidence condition would be at least a certain level, it becomes possible to obtain a captured image with a desired color representation by a solid state imaging device, since no wavelength is present where the light transmittance becomes locally low in the wavelength bands of region G and region B.

Each of the minimum values in transmittance in the wavelength bands of region G and region B under 40° incidence condition as the light transmittance characteristics of IRCF 10 is preferably at least 88%, more preferably at least 90%.

The light transmittance characteristics of IRCF 10 are preferably such that the light transmittance at a wavelength of 1,200 nm under 40° incidence condition is at most 10%. Of a dielectric multi-layer film, the light transmittance characteristics tend to shift towards the short wavelength side when the incidence angle of incident light increases (e.g. the incidence angle changes from vertical incidence to 40° incidence). Therefore, by setting the light transmittance at a wavelength of 1,200 nm under 40° incidence condition to be the above numerical value, it becomes possible to sufficiently cutoff wavelengths of near infrared light even when light has entered obliquely into the near infrared cutoff filter. The light transmittance at a wavelength of 1,200 nm under 40° incidence condition is preferably at most 20%, more preferably at most 15%.

(Film Construction and Light Transmittance Characteristics of Infrared Reflective Layer)

The above infrared reflective layer has a plurality of layered films represented by $(HL)^n$ (where H is a high refractive index film, L is a low refractive index film, n is a natural number of at least 2, and $^n$ means a structure wherein (HL) is repeated n times), and the final light transmittance characteristics of a combination of the plurality of layered films with the absorption characteristics of the substrate are such that the maximum value of the light transmittance in the wavelength band of from 950 to 1,150 nm under vertical incidence condition is preferably at most 10%, more preferably at most 3%.

Further, the infrared reflective layer has a plurality of layered films represented by $(L'MH)^n$ (where H is a high refractive index film, M is an intermediate refractive index film, L' is a low refractive index film, n is a natural number of at least 2, and $^n$ means a structure wherein (L'MH) is repeated n times), and the final light transmittance characteristics of a combination of the plurality of layered films with the absorption characteristics of the substrate are such that the maximum value of the light transmittance in the wavelength band of from 950 to 1,150 nm under vertical incidence condition is preferably at most 10%, more preferably at most 3%.

The reason as to why it is preferred that the infrared reflective layer has a plurality of layered films, will be explained.

At the time when light has entered obliquely into the near infrared cutoff filter, the cause to decrease the light transmittance at wavelengths in the visible region is the infrared reflective layer (a repeatedly-laminated layered film) which constitutes a stopband for wavelengths of from 950 to 1,150 nm (the maximum value in light transmittance under vertical incidence condition in the above wavelength range is at most 10%).

Here, in the present invention, the above high refractive index film H is a QWOT (Quarter-wave Optical Thickness, ¼ wavelength optical film thickness) film at a wavelength of 500 nm made of a high refractive index material. The above intermediate refractive index film M is a QWOT film at a wavelength of 500 nm made of an intermediate refractive index material. The above low refractive index film L or L' is a QWOT film at a wavelength of 500 nm made of a low refractive index material.

In a case where the infrared reflective layer to reflect light in a wavelength band of from 950 to 1,150 nm, is constituted by a single repeatedly-laminated layered film $(HL)^n$ (where H is a high refractive index film, L is a low refractive index film, n is a natural number of at least 2, and $^n$ means a structure wherein (HL) is repeated n times) or $(L'MH)^n$ (where H is a high refractive index film, M is an intermediate refractive index film, L' is a low refractive index film, n is a natural number of at least 2, and $^n$ means a structure wherein (L'MH) is repeated n times), a sharp decrease in light transmittance occurs at any wavelength in the visible region.

Whereas, in a case where the infrared reflective layer to reflect light in a wavelength band of from 950 to 1,150 nm, is constituted by a plurality of repeatedly-laminated layered films, although a decrease in light transmittance at any wavelength in the visible region is observed, the wavelengths at which the light transmittance decreases are different depending upon the respective repeatedly-laminated layered films, and as a result, the overall amount of decrease in light transmittance decreases. That is, in the case where the infrared reflective layer is constituted by a plurality of repeatedly-laminated layered films, as compared with the case where it is constituted by a single repeatedly-laminated layered film, the decrease in light transmittance is dispersed at a plurality of wavelengths without localized at a specific wavelength, and as a result, it is possible to suppress the decrease in light transmittance at wavelengths in the visible region.

Further, the above infrared reflective layer is preferably provided with repeatedly-laminated layered films of a film construction represented by the following formula (6) or (7).

$$a_1(HL)^{\hat{}n1} a_2(HL)^{\hat{}n2} a_3(HL)^{\hat{}n3} \ldots a_m(HL)^{\hat{}nm} \quad (6)$$

$$a_1(HML')^{\hat{}n1} a_2(HML')^{\hat{}n2} a_3(HML')^{\hat{}n3} \ldots a_m(HML')^{\hat{}nm} \quad (7)$$

where each of n1 to nm and m is a natural number of at least 2, and there is at least one combination where the ratio of any different ones among $a_1$ to $a_m$ is at least 1.04.

The plurality of repeatedly-laminated layered films represented by $a_1(HL)^{\hat{}n1} a_2(HL)^{\hat{}n2} a_3(HL)^{\hat{}n3} \ldots a_m(HL)^{\hat{}nm}$, or $a_1(HML')^{\hat{}n1} a_2(HML')^{\hat{}n2} a_3(HML')^{\hat{}n3} \ldots a_m(HML')^{\hat{}nm}$, are required to have at least one combination where the ratio of any different ones among $a_1$ to $a_m$ is at least 1.04. By differentiating the ratio of any different ones among $a_1$ to $a_m$, it becomes possible to differentiate the wavelengths at which the decrease in light transmittance appears depending on the respective repeatedly-laminated layered films. It is thereby possible to obtain the above effect to suppress the decrease in light transmittance at wavelengths in the visible region.

Here, the ratio of any different ones among $a_1$ to $a_m$ means that in the case of m=2, either $a_1/a_z$ or $a_z/a_1$ is at least 1.04. In the case of m being at least 3, among combinations of $a_1$ to $a_m$, the ratio of at least one combination is at least 1.04.

Second Embodiment

Now, the second embodiment of the present invention will be described.

A near infrared cutoff filter 20A (hereinafter sometimes referred to as IRCF20) according to the second embodiment of the present invention comprises a substrate 21 and an infrared reflective layer 22 formed on at least one side of the substrate 21. Here, in IRCF 20 according to the second embodiment, the infrared reflective layer 22 is formed on one side of the substrate 21.

IRCF 20 according to the second embodiment is the same as IRCF 10 according to the above-described first embodiment except that the substrate 21 does not absorb light in the near infrared wavelength region, and therefore, only different points will be described, and description of the overlapping points will be omitted.

(Substrate 21)

The material for the substrate 21 is not particularly limited so long as it transmits at least light in the visible wavelength region and the near infrared wavelength region. The material for the substrate 21 may, for example, be glass, rock crystal, lithium niobate, crystal of sapphire or the like, a polyester resin such as polyethylene terephthalate (PET) or polybutylene terephthalate (PBT), a polyolefin resin such as polyethylene, polypropylene or an ethylene/vinyl acetate copolymer, a norbornene resin, an acryl resin such as polyacrylate or polymethyl methacrylate, an urethane resin, a vinyl chloride resin, a fluoro-resin, a polycarbonate resin, a polyvinyl butyral resin or a polyvinyl alcohol resin.

For example, in a case where glass is to be used as the substrate 21, super white glass is preferably used which does not intentionally contain a component to absorb light in the visible wavelength region and the near infrared wavelength region except for a case where such a component is unavoidably included from a raw material or a production process.

(Light Transmittance Characteristics of Near Infrared Cutoff Filter)

Next, the light transmittance characteristics of the near infrared cutoff filter will be described.

The light transmittance characteristics of IRCF 20 are the same as the above-described light transmittance characteristics of IRCF 10. In IRCF 20, the substrate 21 does not have a characteristic to absorb wavelengths of the near infrared light, and therefore, the light transmittance characteristics of IRCF 20 are the light transmittance characteristics of the infrared reflective film 22. With respect to the light transmittance characteristics of IRCF 20, description will be omitted.

IRCF 20 is bonded to the package of a solid state imaging sensor, and a near infrared cutoff filter may be formed by providing an infrared reflective film 22 on the surface of a low pass filter to suppress moire or the like, or a cover glass to prevent deposition of a foreign matter on the solid state imaging sensor. By such a construction, a member having plural functions is obtainable, and it is possible to reduce the number of components in the imaging device.

Third Embodiment

Next, the third embodiment of the present invention will be described.

A near infrared cutoff filter 30A (hereinafter sometimes referred to as IRCF 30) according to the third embodiment comprises a substrate 31 and an infrared reflective layer 32 formed on at least one side of the substrate 31. Here, in IRCF 30 according to the third embodiment, the infrared reflective layer 32 is formed on one side of the substrate 31.

IRCF 30 according to the third embodiment may have the same construction as above-described IRCF 10 according to the first embodiment or IRCF 20 according to the second embodiment except for the light transmittance characteristics. Only the different light transmittance characteristics will be described below, and description of the points which overlap with other embodiments will be omitted.

(Light Transmittance Characteristics of Near Infrared Cutoff Filter)

IRCF 30 has light transmittance characteristics such that each of the decrease rates in average transmittance in region G and region B calculated by the following formulae (4) and (5), respectively, is at most 0.09.

$$(T(G0)-T(G45))/T(G0) \quad (4)$$

$$(T(B0)-T(B45))/T(B0) \quad (5)$$

where the wavelength band of from 500 to 560 nm is designated as region G, and the wavelength band of from 440 to 480 nm is designated as region B, the respective average transmittances in regions G and B under vertical incidence condition are designated as T(G0) and T(B0), respectively, and the respective average transmittances in regions G and B under 45° incidence condition are designated as T(G45) and T(B45), respectively.

As mentioned in the first embodiment, in the light transmittance characteristics of an infrared reflective layer using an optical multi-layer film, the shift phenomenon of the light transmittance characteristics towards the short wavelength side of region R, along with oblique incidence of light, has heretofore been known. Therefore, in consideration of the shift of the light transmittance characteristics, correction treatment by an image treating device has been studied. However, the shift of the light transmittance characteristics in region G and region B along with oblique incidence of light, appears as a decrease in transmittance at an unspecific position depending upon the film construction or incidence angle, and therefore, correction treatment by an image treating device is impossible.

The light transmittance characteristics of IRCF 30 are such that in the wavelength bands of region G and region B, each of the decrease rates in transmittance when light has shifted from 0° incidence condition to 45° incidence condition is at most 0.09, whereby it becomes possible to obtain a captured image with a desired color representation by a solid state imaging device, since no wavelength is present where the light transmittance becomes locally low in the wavelength bands of region G and region B.

EXAMPLES

Now, the present invention will be described in further detail with reference to Examples, but it should be understood that the present invention is by no means limited to these Examples.

The near infrared cutoff filter in each Example comprises a substrate and, formed on at least one side of the substrate, an infrared reflective layer constituted by a layered film having a high refractive index film and a low refractive index film repeatedly laminated, or a layered film having a high refractive index film, an intermediate refractive index film and a low refractive index film repeatedly laminated.

With respect to such IRCF, in Examples 1 to 5 and Comparative Example 1, verification was conducted by means of an optical thin film simulation software (TFCalc, manufactured by Software Spectra, Inc.).

Further, in the present invention, the refractive indices of the respective films at a wavelength of 500 nm are used as the representative values, and simulation was carried out in consideration of the wavelength dependency of the refractive indices.

Further, in Examples 6 and 7, verification was conducted by measuring the spectral characteristics of a near infrared cutoff filter having repeatedly-laminated layered films formed on a glass substrate using a prescribed film deposition device.

A refractive index has a wavelength dependency so-called e.g. dispersion. For example, in a wavelength range of from 300 to 1,300 nm, e.g. of a film material in the present invention, the refractive index tends to be larger as the wavelength is shorter, and the refractive index tends to be smaller as the wavelength is longer. Such a relation between the wavelength and the refractive index is not a linear relation and is usually represented by using an approximation formula such as Hartmann, Sellmeiner in many cases.

Further, the refractive index (dispersion) of a film material varies also depending upon various film deposition methods, film deposition conditions, etc. Therefore, film deposition was actually carried out by e.g. a vapor deposition method, an ion assisted vapor deposition method or a sputtering method, and the dispersion data of the refractive index of each film thereby obtained, were used in the following simulation.

Further, the film thickness of a film construction shown in the following Examples and Comparative Examples is a physical film thickness.

Further, the side where the film layer number in a film construction is 1, is the substrate side, and the side where the film layer number is the maximum, is the air side.

Example 1

In Example 1, a near infrared cutoff filter was prepared by using a near infrared absorbing glass (manufactured by AGC Techno Glass Co., Ltd., trade name: NF-50T (0.3 mm), fluorophosphate glass) as a substrate, and forming, on the front side of this substrate, an infrared reflective layer constituted by a layered film having a high refractive index film H ($TiO_2$) and a low refractive index film L ($SiO_2$) alternately repeatedly laminated, and forming, on the rear side of the substrate, an antireflection film (AR) composed of six layers. With respect to the obtained near infrared cutoff filter, the spectral characteristics were simulated. Here, as the refractive index of $TiO_2$, 2.467 was used, and as the refractive index of $SiO_2$, 1.483 was used.

The repeatedly-laminated layered film construction of the infrared reflective layer in Example 1 is shown in Table 1. Further, the repeatedly-laminated layered film construction of the antireflection film in Example 1 is shown in Table 2.

TABLE 1

| Film layer number | Film material | Film thickness [nm] |
|---|---|---|
| 1 | $TiO_2$ | 14.27 |
| 2 | $SiO_2$ | 46.12 |
| 3 | $TiO_2$ | 21.4 |
| 4 | $SiO_2$ | 182.52 |
| 5 | $TiO_2$ | 90.48 |
| 6 | $SiO_2$ | 148.42 |
| 7 | $TiO_2$ | 84.17 |
| 8 | $SiO_2$ | 143.9 |
| 9 | $TiO_2$ | 82.7 |
| 10 | $SiO_2$ | 142.37 |
| 11 | $TiO_2$ | 82.08 |
| 12 | $SiO_2$ | 141.76 |
| 13 | $TiO_2$ | 81.79 |
| 14 | $SiO_2$ | 141.46 |
| 15 | $TiO_2$ | 81.64 |
| 16 | $SiO_2$ | 142.1 |
| 17 | $TiO_2$ | 81.71 |
| 18 | $SiO_2$ | 142.49 |
| 19 | $TiO_2$ | 82.59 |
| 20 | $SiO_2$ | 144.51 |
| 21 | $TiO_2$ | 83.62 |
| 22 | $SiO_2$ | 148.35 |
| 23 | $TiO_2$ | 88.93 |
| 24 | $SiO_2$ | 160.79 |
| 25 | $TiO_2$ | 102.11 |
| 26 | $SiO_2$ | 179.04 |
| 27 | $TiO_2$ | 102.44 |
| 28 | $SiO_2$ | 165.06 |
| 29 | $TiO_2$ | 100.03 |
| 30 | $SiO_2$ | 180 |
| 31 | $TiO_2$ | 112.35 |
| 32 | $SiO_2$ | 189.41 |
| 33 | $TiO_2$ | 114.19 |
| 34 | $SiO_2$ | 190.21 |
| 35 | $TiO_2$ | 113.83 |
| 36 | $SiO_2$ | 187.47 |
| 37 | $TiO_2$ | 113.45 |
| 38 | $SiO_2$ | 95.55 |

TABLE 2

| Film layer number | Film material | Film thickness [nm] |
|---|---|---|
| 1 | $TiO_2$ | 12.73 |
| 2 | $SiO_2$ | 32.8 |
| 3 | $TiO_2$ | 57.04 |
| 4 | $SiO_2$ | 6 |
| 5 | $TiO_2$ | 38.54 |
| 6 | $SiO_2$ | 86.46 |

Figure 4:
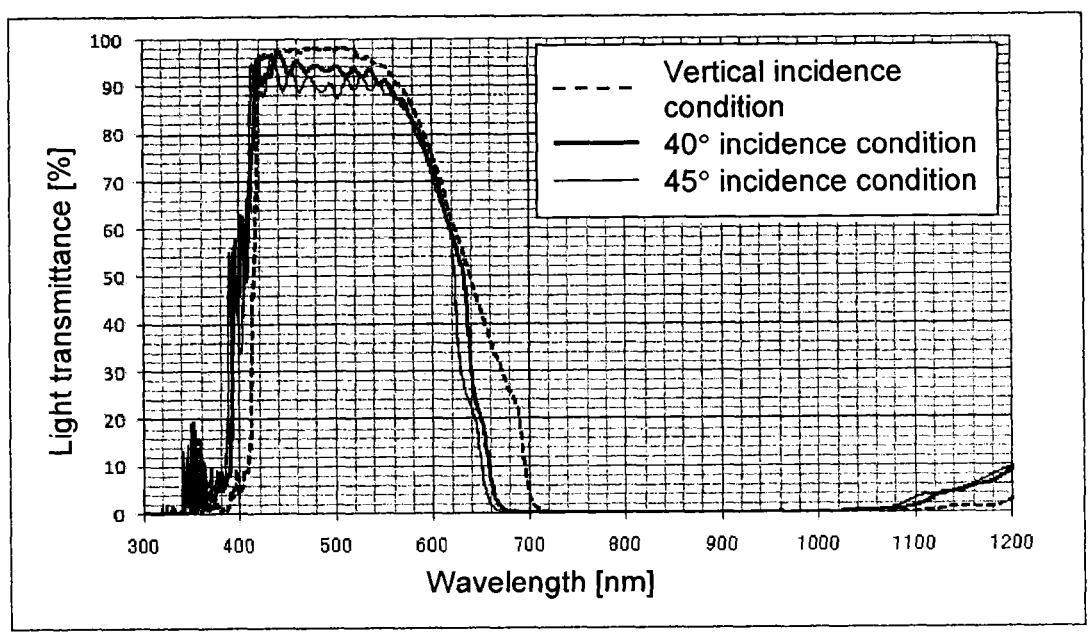
FIG. 4 is a graph showing the light transmittance characteristics at incidence angles of 0°, 40° and 45° of the near infrared cutoff filter in Example 1.

FIG. 4 shows the results of simulation of the spectral characteristics of the near infrared cutoff filter in Example 1. In FIG. 4, the ordinate represents the transmittance, and the abscissa represents the wavelength. FIG. 4 shows the simulation results under vertical (0°) incidence condition, under 40° incidence condition and under 45° incidence condition.

From the simulation results, the average transmittances in the wavelength bands of regions R, G and B under vertical incidence condition, the average transmittances in the wavelength bands of regions R, G and B under 40° and 45° incidence conditions, and the minimum values in the wavelength bands of regions G and B under 40° incidence condition, were obtained.

Further, from the average transmittances in the respective regions, the decrease rates in average transmittance between under 0° incidence condition and under 40° incidence condition, were obtained, and the difference between the maximum value and the minimum value thereof was calculated.

Further, from the average transmittances in the respective regions, the decrease rates in average transmittance between under 0° incidence condition and under 45° incidence condition, were obtained. These results are shown in Table 10.

In the near infrared cutoff filter in Example 1, repeatedly laminated layered films shown by film layer numbers 19 to 36 in the film construction in Table 1 are ones to make the maximum value of light transmittance in the wavelength band of from 950 to 1,150 nm to be at most 10%. These films take a construction provided with a plurality of repeatedly-laminated layered films represented by $(HL)^n$. And, since the wavelength at which the decrease in light transmittance appears in the visible light wavelength region, is differentiated depending on the respective repeatedly-laminated layered films, the decrease in light transmittance at wavelengths in the visible region is suppressed, and each of the minimum values in light transmittance in regions G and B is at least 85%.

Example 2

In Example 2, a near infrared cutoff filter was prepared by using the same substrate as in Example 1 and forming, on the front side of this substrate, an infrared reflective layer having a high refractive index film H ($TiO_2$), an intermediate refractive index film M ($Al_2O_3$) and a low refractive index film L' ($SiO_2$) alternately repeatedly laminated, and forming, on the rear side of the substrate, the same antireflection film (AR) composed of six layers as in Example 1. With respect to the obtained near infrared cutoff filter, the spectral characteristics were simulated.

Here, as the refractive index of $TiO_2$, 2.467 was used, as the refractive index of $SiO_2$, 1.483 was used, as the refractive index of $Al_2O_3$, 1.638 was used, and further, as the refractive index of $Al_2O_3+ZrO_2$ (a composite oxide film of alumina and zirconium oxide), 1.646 was used.

In the repeatedly-laminated layered film construction in Table 3, the film layer number 1 ($Al_2O_3+ZrO_2$: 59.39 nm) is a layer to improve the adhesion between the infrared reflective layer and the substrate. Therefore, the infrared reflective layer is constituted by film layer numbers 2 to 56. Here, the film layer number 1 is one which does not function as an infrared reflective layer.

The repeatedly-laminated layered film construction of the infrared reflective layer in Example 2 is shown in Table 3.

TABLE 3

| Film layer number | Film material | Film thickness [nm] |
| --- | --- | --- |
| 1 | $Al_2O_3 + ZrO_2$ | 59.39 |
| 2 | $SiO_2$ | 63.36 |
| 3 | $Al_2O_3$ | 99.36 |

TABLE 3-continued

| Film layer number | Film material | Film thickness [nm] |
| --- | --- | --- |
| 4 | $TiO_2$ | 104.31 |
| 5 | $Al_2O_3$ | 43.04 |
| 6 | $SiO_2$ | 87.06 |
| 7 | $Al_2O_3$ | 62.49 |
| 8 | $TiO_2$ | 115.93 |
| 9 | $Al_2O_3$ | 80.31 |
| 10 | $SiO_2$ | 66.64 |
| 11 | $Al_2O_3$ | 43.33 |
| 12 | $TiO_2$ | 103.74 |
| 13 | $Al_2O_3$ | 35.46 |
| 14 | $SiO_2$ | 88.44 |
| 15 | $Al_2O_3$ | 70.32 |
| 16 | $TiO_2$ | 118.07 |
| 17 | $Al_2O_3$ | 62.27 |
| 18 | $SiO_2$ | 104.53 |
| 19 | $Al_2O_3$ | 28.6 |
| 20 | $TiO_2$ | 106.33 |
| 21 | $Al_2O_3$ | 45.87 |
| 22 | $SiO_2$ | 38.06 |
| 23 | $Al_2O_3$ | 98.61 |
| 24 | $TiO_2$ | 119.81 |
| 25 | $Al_2O_3$ | 100.17 |
| 26 | $SiO_2$ | 27.99 |
| 27 | $Al_2O_3$ | 50.61 |
| 28 | $TiO_2$ | 107.37 |
| 29 | $Al_2O_3$ | 19.41 |
| 30 | $SiO_2$ | 162.24 |
| 31 | $TiO_2$ | 101.27 |
| 32 | $SiO_2$ | 168.68 |
| 33 | $TiO_2$ | 103.66 |
| 34 | $SiO_2$ | 178.68 |
| 35 | $TiO_2$ | 103.4 |
| 36 | $SiO_2$ | 161.86 |
| 37 | $TiO_2$ | 88.54 |
| 38 | $SiO_2$ | 148.7 |
| 39 | $TiO_2$ | 84.43 |
| 40 | $SiO_2$ | 143.95 |
| 41 | $TiO_2$ | 82.89 |
| 42 | $SiO_2$ | 142.81 |
| 43 | $TiO_2$ | 82.56 |
| 44 | $SiO_2$ | 141.9 |
| 45 | $TiO_2$ | 82.23 |
| 46 | $SiO_2$ | 141.93 |
| 47 | $TiO_2$ | 82.61 |
| 48 | $SiO_2$ | 142.22 |
| 49 | $TiO_2$ | 82.63 |
| 50 | $SiO_2$ | 142.78 |
| 51 | $TiO_2$ | 83.69 |
| 52 | $SiO_2$ | 144.96 |
| 53 | $TiO_2$ | 85.42 |
| 54 | $SiO_2$ | 151.35 |
| 55 | $TiO_2$ | 84.71 |
| 56 | $SiO_2$ | 73.45 |

Figure 5:
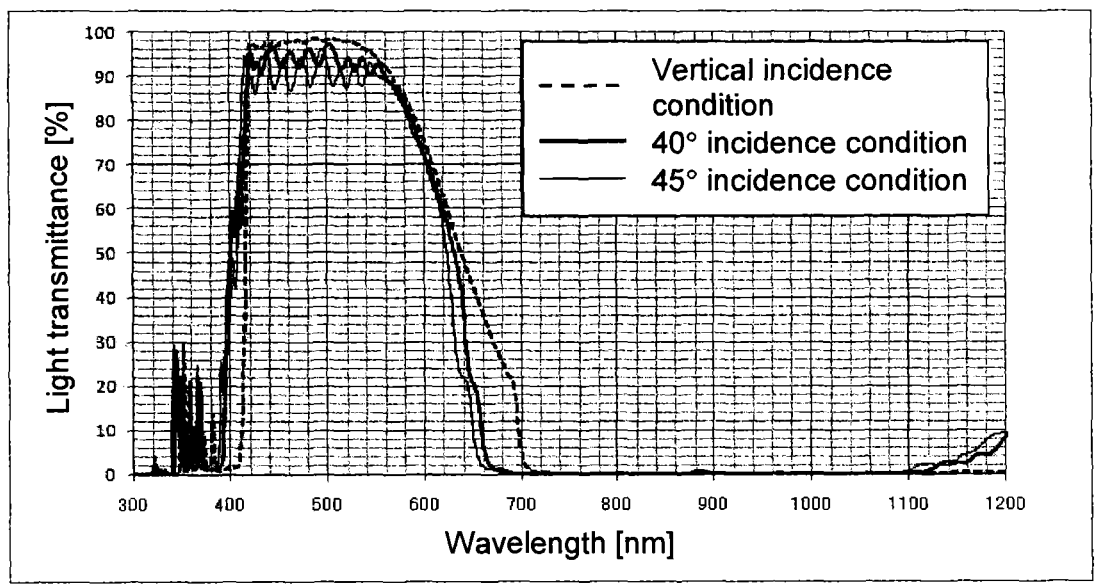
FIG. 5 is a graph showing the light transmittance characteristics at incidence angles of 0°, 40° and 45° of the near infrared cutoff filter in Example 2.

FIG. 5 shows the simulation results of the spectral characteristics of the near infrared cutoff filter in Example 2. In FIG. 5, the ordinate represents the transmittance, and the abscissa represents the wavelength. FIG. 5 shows the simulation results under vertical (0°) incidence condition, under 40° incidence condition and under 45° incidence condition.

From the simulation results, the average transmittances in the wavelength bands of regions R, G and B under vertical incidence condition, the average transmittances in the wavelength bands of regions R, G and B under 40° and 45° incidence conditions, and the minimum values in the wavelength bands of regions G and B under 40° incidence condition, were obtained.

Further, from the average transmittances in the respective regions, the decrease rates in average transmittance between under 0° incidence condition and under 40° incidence condition, were obtained, and the difference between the maximum value and the minimum value thereof was calculated.

Further, from the average transmittances in the respective regions, the decrease rates in average transmittance between under 0° incidence condition and under 45° incidence condition, were obtained. These results are shown in Table 10.

Example 3

In Example 3, a near infrared cutoff filter was prepared by using a near infrared absorbing glass (manufactured by AGC Techno Glass Co., Ltd., trade name: NF-50T (0.25 mm), fluorophosphate glass) as a substrate, and forming, on the front side of this substrate, an infrared reflective layer constituted by a layered film having a high refractive index film H ($TiO_2$), an intermediate refractive index film M ($Ta_2O_5$) and a low refractive index film L' ($SiO_2$) alternately repeatedly laminated, and forming, on the rear side of the substrate, an infrared reflective layer having a film construction different from the front side and constituted by a layered film having a high refractive index film H, an intermediate refractive index film M and a low refractive index film L' alternately repeatedly laminated. With respect to the obtained near infrared cutoff filter, the spectral characteristics were simulated.

Here, as the refractive index of $TiO_2$, 2.467 was used, as the refractive index of $SiO_2$, 1.483 was used, as the refractive index of $Ta_2O_5$, 2.194 was used, and as the refractive index of $MgF_2$, 1.424 was used.

In the repeatedly-laminated layered film construction in Table 4, the film layer number 1 ($TiO_2$: 10 nm) and the film layer number 2 ($MgF_2$: 170 nm) are layers to improve the adhesion between the infrared reflective layer and the substrate. Therefore, the infrared reflective layer is constituted by film layer numbers 3 to 86. Here, the film layer number 1 and the film layer number 2 are ones which do not function as infrared reflective layers.

The repeatedly-laminated layered film constructions of the infrared reflective layers in Example 3 are shown in Tables 4 and 5.

TABLE 4

| Film layer number | Film material | Film thickness [nm] |
| --- | --- | --- |
| 1 | $TiO_2$ | 10 |
| 2 | $MgF_2$ | 170 |
| 3 | $SiO_2$ | 23.25 |
| 4 | $Ta_2O_5$ | 23.82 |
| 5 | $TiO_2$ | 62.74 |
| 6 | $Ta_2O_5$ | 39.59 |
| 7 | $SiO_2$ | 35 |
| 8 | $Ta_2O_5$ | 50.29 |
| 9 | $TiO_2$ | 51.74 |
| 10 | $Ta_2O_5$ | 41.29 |
| 11 | $SiO_2$ | 28.94 |
| 12 | $Ta_2O_5$ | 49.7 |
| 13 | $TiO_2$ | 52.63 |
| 14 | $Ta_2O_5$ | 42.13 |
| 15 | $SiO_2$ | 29.64 |
| 16 | $Ta_2O_5$ | 49.35 |
| 17 | $TiO_2$ | 51.57 |
| 18 | $Ta_2O_5$ | 42.59 |
| 19 | $SiO_2$ | 30.75 |
| 20 | $Ta_2O_5$ | 47.68 |
| 21 | $TiO_2$ | 52.13 |
| 22 | $Ta_2O_5$ | 42.34 |
| 23 | $SiO_2$ | 33.38 |
| 24 | $Ta_2O_5$ | 48.37 |
| 25 | $TiO_2$ | 52.23 |
| 26 | $Ta_2O_5$ | 40.66 |
| 27 | $SiO_2$ | 32.17 |
| 28 | $Ta_2O_5$ | 46.52 |
| 29 | $TiO_2$ | 53.38 |
| 30 | $Ta_2O_5$ | 41.02 |
| 31 | $SiO_2$ | 33.97 |
| 32 | $Ta_2O_5$ | 47.27 |
| 33 | $TiO_2$ | 50.4 |
| 34 | $Ta_2O_5$ | 42.76 |
| 35 | $SiO_2$ | 35.18 |
| 36 | $Ta_2O_5$ | 45.82 |
| 37 | $TiO_2$ | 53.73 |
| 38 | $Ta_2O_5$ | 40.35 |
| 39 | $SiO_2$ | 33.89 |
| 40 | $Ta_2O_5$ | 45.75 |
| 41 | $TiO_2$ | 54.49 |
| 42 | $Ta_2O_5$ | 40.2 |
| 43 | $SiO_2$ | 32.81 |
| 44 | $Ta_2O_5$ | 46.2 |
| 45 | $TiO_2$ | 52.11 |
| 46 | $Ta_2O_5$ | 42.93 |
| 47 | $SiO_2$ | 32.77 |
| 48 | $Ta_2O_5$ | 45.89 |
| 49 | $TiO_2$ | 51.2 |
| 50 | $Ta_2O_5$ | 45.22 |
| 51 | $SiO_2$ | 29.96 |
| 52 | $Ta_2O_5$ | 40.65 |
| 53 | $TiO_2$ | 56.58 |
| 54 | $Ta_2O_5$ | 44.85 |
| 55 | $SiO_2$ | 30.02 |
| 56 | $Ta_2O_5$ | 41.27 |
| 57 | $TiO_2$ | 54 |
| 58 | $Ta_2O_5$ | 47.12 |
| 59 | $SiO_2$ | 31.02 |
| 60 | $Ta_2O_5$ | 42.56 |
| 61 | $TiO_2$ | 51.46 |
| 62 | $Ta_2O_5$ | 48.73 |
| 63 | $SiO_2$ | 30.57 |
| 64 | $Ta_2O_5$ | 42.3 |
| 65 | $TiO_2$ | 52.21 |
| 66 | $Ta_2O_5$ | 48.62 |
| 67 | $SiO_2$ | 29.98 |
| 68 | $Ta_2O_5$ | 44.8 |
| 69 | $TiO_2$ | 50.14 |
| 70 | $Ta_2O_5$ | 50.09 |
| 71 | $SiO_2$ | 26.95 |
| 72 | $Ta_2O_5$ | 42.19 |
| 73 | $TiO_2$ | 54.11 |
| 74 | $Ta_2O_5$ | 49.34 |
| 75 | $SiO_2$ | 27.21 |
| 76 | $Ta_2O_5$ | 44.78 |
| 77 | $TiO_2$ | 53.03 |
| 78 | $Ta_2O_5$ | 48.89 |
| 79 | $SiO_2$ | 28.48 |
| 80 | $Ta_2O_5$ | 49.45 |
| 81 | $TiO_2$ | 53.69 |
| 82 | $Ta_2O_5$ | 44.46 |
| 83 | $SiO_2$ | 29.65 |
| 84 | $Ta_2O_5$ | 63.27 |
| 85 | $TiO_2$ | 55.34 |
| 86 | $SiO_2$ | 81.55 |

TABLE 5

| Film layer number | Film material | Film thickness [nm] |
| --- | --- | --- |
| 1 | $TiO_2$ | 16.08 |
| 2 | $MgF_2$ | 35 |
| 3 | $TiO_2$ | 46.74 |
| 4 | $SiO_2$ | 20.24 |
| 5 | $TiO_2$ | 45.04 |
| 6 | $SiO_2$ | 48.77 |
| 7 | $TiO_2$ | 20.48 |
| 8 | $SiO_2$ | 87.96 |
| 9 | $TiO_2$ | 10.52 |
| 10 | $SiO_2$ | 93.98 |
| 11 | $TiO_2$ | 25.03 |
| 12 | $SiO_2$ | 29.9 |
| 13 | $TiO_2$ | 50.56 |
| 14 | $SiO_2$ | 47.96 |
| 15 | $TiO_2$ | 7.04 |
| 16 | $SiO_2$ | 111.2 |

TABLE 5-continued

| Film layer number | Film material | Film thickness [nm] |
| --- | --- | --- |
| 17 | TiO$_2$ | 94.74 |
| 18 | SiO$_2$ | 140.19 |
| 19 | Ta$_2$O$_5$ | 37.85 |
| 20 | TiO$_2$ | 30.96 |
| 21 | Ta$_2$O$_5$ | 29.35 |
| 22 | SiO$_2$ | 138.12 |
| 23 | Ta$_2$O$_5$ | 23.33 |
| 24 | TiO$_2$ | 32.42 |
| 25 | Ta$_2$O$_5$ | 42.7 |
| 26 | SiO$_2$ | 123.11 |
| 27 | Ta$_2$O$_5$ | 38.16 |
| 28 | TiO$_2$ | 33.97 |
| 29 | Ta$_2$O$_5$ | 29.32 |
| 30 | SiO$_2$ | 130.74 |
| 31 | Ta$_2$O$_5$ | 35.76 |
| 32 | TiO$_2$ | 31.56 |
| 33 | Ta$_2$O$_5$ | 31.29 |
| 34 | SiO$_2$ | 133.17 |
| 35 | Ta$_2$O$_5$ | 30.76 |
| 36 | TiO$_2$ | 33.73 |
| 37 | Ta$_2$O$_5$ | 35.47 |
| 38 | SiO$_2$ | 131.67 |
| 39 | Ta$_2$O$_5$ | 32 |
| 40 | TiO$_2$ | 34.98 |
| 41 | Ta$_2$O$_5$ | 36.28 |
| 42 | SiO$_2$ | 133.15 |
| 43 | Ta$_2$O$_5$ | 37.67 |
| 44 | TiO$_2$ | 36.74 |
| 45 | Ta$_2$O$_5$ | 33.12 |
| 46 | SiO$_2$ | 149.52 |
| 47 | Ta$_2$O$_5$ | 36.47 |
| 48 | TiO$_2$ | 41.33 |
| 49 | Ta$_2$O$_5$ | 42.48 |
| 50 | SiO$_2$ | 166.48 |
| 51 | Ta$_2$O$_5$ | 43.91 |
| 52 | TiO$_2$ | 41.59 |
| 53 | Ta$_2$O$_5$ | 40.02 |
| 54 | SiO$_2$ | 160.16 |
| 55 | Ta$_2$O$_5$ | 40.2 |
| 56 | TiO$_2$ | 35.43 |
| 57 | Ta$_2$O$_5$ | 43.34 |
| 58 | SiO$_2$ | 155.49 |
| 59 | Ta$_2$O$_5$ | 40.99 |
| 60 | TiO$_2$ | 34.98 |
| 61 | Ta$_2$O$_5$ | 43.08 |
| 62 | SiO$_2$ | 163.27 |
| 63 | Ta$_2$O$_5$ | 42.25 |
| 64 | TiO$_2$ | 39.29 |
| 65 | Ta$_2$O$_5$ | 48.24 |
| 66 | SiO$_2$ | 176.85 |
| 67 | Ta$_2$O$_5$ | 47.95 |
| 68 | TiO$_2$ | 39.9 |
| 69 | Ta$_2$O$_5$ | 43.68 |
| 70 | SiO$_2$ | 171.8 |
| 71 | Ta$_2$O$_5$ | 43.81 |
| 72 | TiO$_2$ | 40.29 |
| 73 | Ta$_2$O$_5$ | 49.58 |
| 74 | SiO$_2$ | 181.35 |
| 75 | Ta$_2$O$_5$ | 48.14 |
| 76 | TiO$_2$ | 39.79 |
| 77 | Ta$_2$O$_5$ | 43.24 |
| 78 | SiO$_2$ | 172.68 |
| 79 | Ta$_2$O$_5$ | 45.42 |
| 80 | TiO$_2$ | 39.87 |
| 81 | Ta$_2$O$_5$ | 48.12 |
| 82 | SiO$_2$ | 185.77 |
| 83 | Ta$_2$O$_5$ | 58.5 |
| 84 | TiO2 | 43.5 |
| 85 | Ta$_2$O$_5$ | 21.57 |
| 86 | SiO$_2$ | 81.01 |

Figure 6:
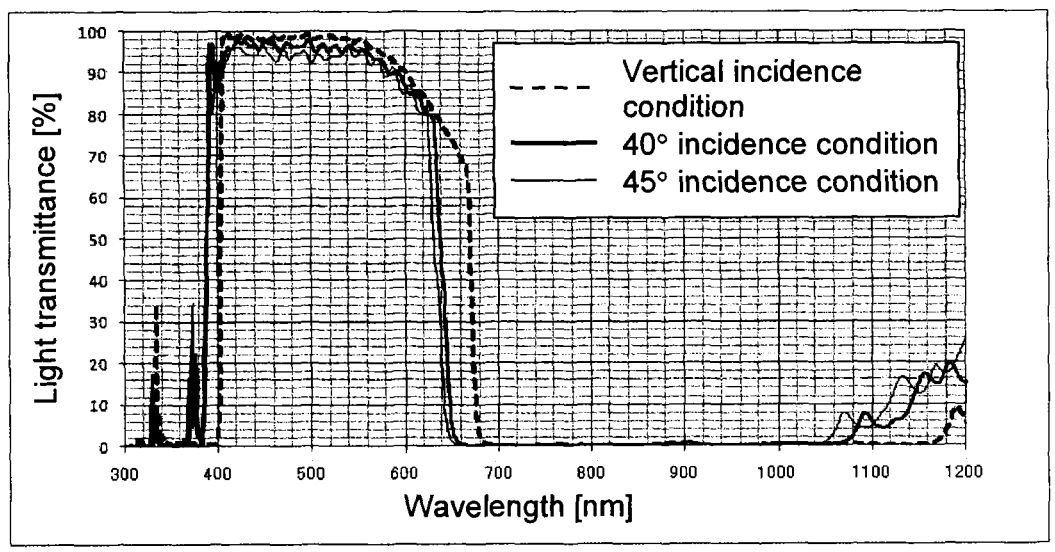
FIG. 6 is a graph showing the light transmittance characteristics at incidence angles of 0°, 40° and 45° of the near infrared cutoff filter in Example 3.

FIG. 6 shows the simulation results of the spectral characteristics of the near infrared cutoff filter in Example 3. In FIG. 6, the ordinate represents the transmittance, and the abscissa represents the wavelength. FIG. 6 shows the simulation results under vertical (0°) incidence condition, under 40° incidence condition and under 45° incidence condition.

From the simulation results, the average transmittances in the wavelength bands of regions R, G and B under vertical incidence condition, the average transmittances in the wavelength bands of regions R, G and B under 40° and 45° incidence conditions, and the minimum values in the wavelength bands of regions G and B under 40° incidence condition, were obtained.

Further, from the average transmittances in the respective regions, the decrease rates in average transmittance between under 0° incidence condition and under 40° incidence condition, were obtained, and the difference between the maximum value and the minimum value thereof was calculated.

Further, from the average transmittances in the respective regions, the decrease rates in average transmittance between under 0° incidence condition and under 45° incidence condition, were obtained. These results are shown in Table 10.

Example 4

In Example 4, a near infrared cutoff filter was prepared by using the same substrate as in Example 1 and forming, on the front side of this substrate, an infrared reflective layer constituted by a layered film having a high refractive index film H (TiO$_2$) and a low refractive index film L (SiO$_2$) alternately repeatedly laminated, and forming, on the rear side of the substrate, the same antireflection film (AR) composed of six layers as in Example 1. With respect to the obtained near infrared cutoff filter, the spectral characteristics were simulated.

Here, as the refractive index of TiO$_2$, 2.368 was used, as the refractive index of SiO$_2$, 1.456 was used, and further, as the refractive index of Al$_2$O$_3$+ZrO$_2$ (a composite oxide film of alumina and zirconium oxide), 1.663 was used.

In the repeatedly-laminated layered film construction in Table 6, the film layer number 1 (Al$_2$O$_3$+ZrO$_2$: 16.4 nm) is a layer to improve the adhesion between the infrared reflective layer and the substrate. Therefore, the infrared reflective layer is constituted by film layer numbers 2 to 39. Here, the film layer number 1 is one which does not function as an infrared reflective layer.

The repeatedly-laminated layered film construction of the infrared reflective layer in Example 4 is shown in Table 6.

TABLE 6

| Film layer number | Film material | Film thickness [nm] |
| --- | --- | --- |
| 1 | Al$_2$O$_3$ + ZrO$_2$ | 16.4 |
| 2 | TiO$_2$ | 7.55 |
| 3 | SiO$_2$ | 32.5 |
| 4 | TiO$_2$ | 103.39 |
| 5 | SiO$_2$ | 157.33 |
| 6 | TiO$_2$ | 88.38 |
| 7 | SiO$_2$ | 146.14 |
| 8 | TiO$_2$ | 86.51 |
| 9 | SiO$_2$ | 143.31 |
| 10 | TiO$_2$ | 84.06 |
| 11 | SiO$_2$ | 143.21 |
| 12 | TiO$_2$ | 83.34 |
| 13 | SiO$_2$ | 142.14 |
| 14 | TiO$_2$ | 83.61 |
| 15 | SiO$_2$ | 142.86 |
| 16 | TiO$_2$ | 83.38 |
| 17 | SiO$_2$ | 144.32 |
| 18 | TiO$_2$ | 84.13 |
| 19 | SiO$_2$ | 144.88 |
| 20 | TiO$_2$ | 84.99 |
| 21 | SiO$_2$ | 147.6 |
| 22 | TiO$_2$ | 90.86 |
| 23 | SiO$_2$ | 162.58 |
| 24 | TiO$_2$ | 107.85 |

TABLE 6-continued

| Film layer number | Film material | Film thickness [nm] |
|---|---|---|
| 25 | SiO$_2$ | 185.81 |
| 26 | TiO$_2$ | 107.64 |
| 27 | SiO$_2$ | 164.25 |
| 28 | TiO$_2$ | 101.02 |
| 29 | SiO$_2$ | 181.75 |
| 30 | TiO$_2$ | 118.95 |
| 31 | SiO$_2$ | 193.82 |
| 32 | TiO$_2$ | 119.98 |
| 33 | SiO$_2$ | 195.08 |
| 34 | TiO$_2$ | 120.41 |
| 35 | SiO$_2$ | 194.74 |
| 36 | TiO$_2$ | 118.99 |
| 37 | SiO$_2$ | 193.36 |
| 38 | TiO$_2$ | 118.08 |
| 39 | SiO$_2$ | 97.99 |

Figure 7:
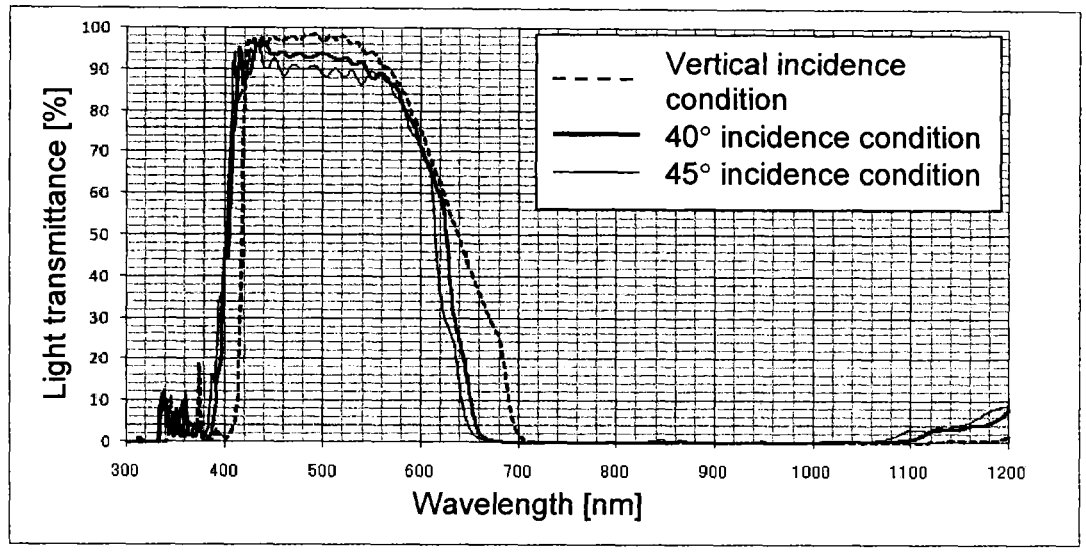
FIG. 7 is a graph showing the light transmittance characteristics at incidence angles of 0°, 40° and 45° of the near infrared cutoff filter in Example 4.

FIG. 7 shows the simulation results of the spectral characteristics of the near infrared cutoff filter in Example 4. In FIG. 7, the ordinate represents the transmittance, and the abscissa represents the wavelength. FIG. 7 shows the simulation results under vertical (0°) incidence condition, under 40° incidence condition and under 45° incidence condition.

From the simulation results, the average transmittances in the wavelength bands of regions R, G and B under vertical incidence condition, the average transmittances in the wavelength bands of regions R, G and B under 40° and 45° incidence conditions, and the minimum values in the wavelength bands of regions G and B under 40° incidence condition, were obtained.

Further, from the average transmittances in the respective regions, the decrease rates in average transmittance between under 0° incidence condition and under 40° incidence condition, were obtained, and the difference between the maximum value and the minimum value thereof was calculated.

Further, from the average transmittances in the respective regions, the decrease rates in average transmittance between under 0° incidence condition and under 45° incidence condition, were obtained. These results are shown in Table 10.

Example 5

In Example 5, a near infrared cutoff filter was prepared by using the same substrate as in Example 1 and forming, on the front side of this substrate, an infrared reflective layer constituted by a layered film having a high refractive index film H (TiO$_2$) and a low refractive index film L (SiO$_2$) alternately repeatedly laminated, and forming, on the rear side of the substrate, the same antireflection film (AR) composed of six layers as in Example 1. With respect to the obtained near infrared cutoff filter, the spectral characteristics were simulated.

Here, as the refractive index of TiO$_2$, 2.368 was used, as the refractive index of SiO$_2$, 1.456 was used, and further, as the refractive index of Al$_2$O$_3$+ZrO$_2$ (a composite oxide film of alumina and zirconium oxide), 1.663 was used.

In the repeatedly-laminated layered film construction in Table 7, the film layer number 1 (Al$_2$O$_3$+ZrO$_2$: 16.4 nm) is a layer to improve the adhesion between the infrared reflective layer and the substrate. Therefore, the infrared reflective layer is constituted by film layer numbers 2 to 39. Here, the film layer number 1 is one which does not function as an infrared reflective layer.

The repeatedly-laminated layered film construction of the infrared reflective layer in Example 5 is shown in Table 7.

TABLE 7

| Film layer number | Film material | Film thickness [nm] |
|---|---|---|
| 1 | Al$_2$O$_3$ + ZrO$_2$ | 10 |
| 2 | TiO$_2$ | 13.34 |
| 3 | SiO$_2$ | 38.57 |
| 4 | TiO$_2$ | 123.28 |
| 5 | SiO$_2$ | 191.33 |
| 6 | TiO$_2$ | 118.55 |
| 7 | SiO$_2$ | 196.67 |
| 8 | TiO$_2$ | 119.29 |
| 9 | SiO$_2$ | 196.82 |
| 10 | TiO$_2$ | 119.34 |
| 11 | SiO$_2$ | 195.64 |
| 12 | TiO$_2$ | 118.1 |
| 13 | SiO$_2$ | 187.94 |
| 14 | TiO$_2$ | 102.65 |
| 15 | SiO$_2$ | 164.06 |
| 16 | TiO$_2$ | 104.2 |
| 17 | SiO$_2$ | 187.87 |
| 18 | TiO$_2$ | 108.58 |
| 19 | SiO$_2$ | 164.16 |
| 20 | TiO$_2$ | 90.52 |
| 21 | SiO$_2$ | 149.57 |
| 22 | TiO$_2$ | 84.88 |
| 23 | SiO$_2$ | 144.7 |
| 24 | TiO$_2$ | 84.45 |
| 25 | SiO$_2$ | 143.34 |
| 26 | TiO$_2$ | 82.67 |
| 27 | SiO$_2$ | 142.38 |
| 28 | TiO$_2$ | 83.34 |
| 29 | SiO$_2$ | 141.19 |
| 30 | TiO$_2$ | 83.82 |
| 31 | SiO$_2$ | 142.27 |
| 32 | TiO$_2$ | 84.68 |
| 33 | SiO$_2$ | 141.88 |
| 34 | TiO$_2$ | 85.28 |
| 35 | SiO$_2$ | 145.21 |
| 36 | TiO$_2$ | 87.14 |
| 37 | SiO$_2$ | 150.07 |
| 38 | TiO$_2$ | 86.01 |
| 39 | SiO$_2$ | 75.47 |

Figure 8:
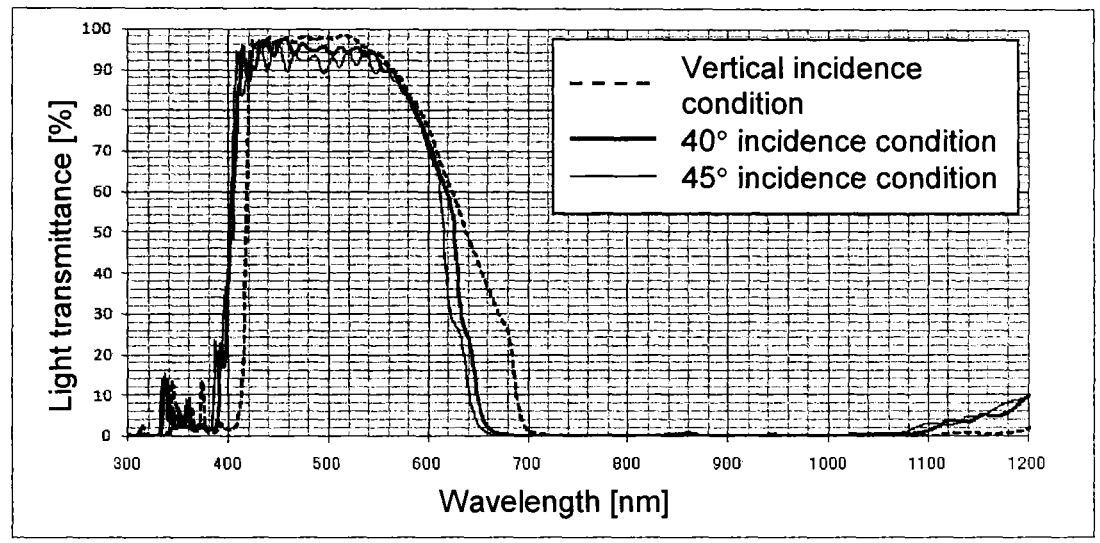
FIG. 8 is a graph showing the light transmittance characteristics at incidence angles of 0°, 40° and 45° of the near infrared cutoff filter in Example 5.

FIG. 8 shows the simulation results of the spectral characteristics of the near infrared cutoff filter in Example 5. In FIG. 8, the ordinate represents the transmittance, and the abscissa represents the wavelength. FIG. 8 shows the simulation results under vertical (0°) incidence condition, under 40° incidence condition and under 45° incidence condition.

From the simulation results, the average transmittances in the wavelength bands of regions R, G and B under vertical incidence condition, the average transmittances in the wavelength bands of regions R, G and B under 40° and 45° incidence conditions, and the minimum values in the wavelength bands of regions G and B under 40° incidence condition, were obtained.

Further, from the average transmittances in the respective regions, the decrease rates in average transmittance between under 0° incidence condition and under 40° incidence condition, were obtained, and the difference between the maximum value and the minimum value thereof was calculated.

Further, from the average transmittances in the respective regions, the decrease rates in average transmittance between under 0° incidence condition and under 45° incidence condition, were obtained. These results are shown in Table 10.

Example 6

In Example 6, a near infrared cutoff filter was prepared by using the same substrate as in Example 1 and forming, on the front side of this substrate, an infrared reflective layer (the same as in Table 7) constituted by a repeatedly-laminated layered film as described in Example 5, and forming, on the rear side of the substrate, the same antireflection film (AR)

composed of six layers as in Example 1, and the spectral characteristics were measured.

Here, as the refractive index of $TiO_2$, 2.368 was used, as the refractive index of $SiO_2$, 1.456 was used, and further, as the refractive index of $Al_2O_3+ZrO_2$ (a composite oxide film of alumina and zirconium oxide), 1.663 was used. The infrared reflective layer and the antireflection film were formed by means of a heating vapor deposition device.

Figure 9:
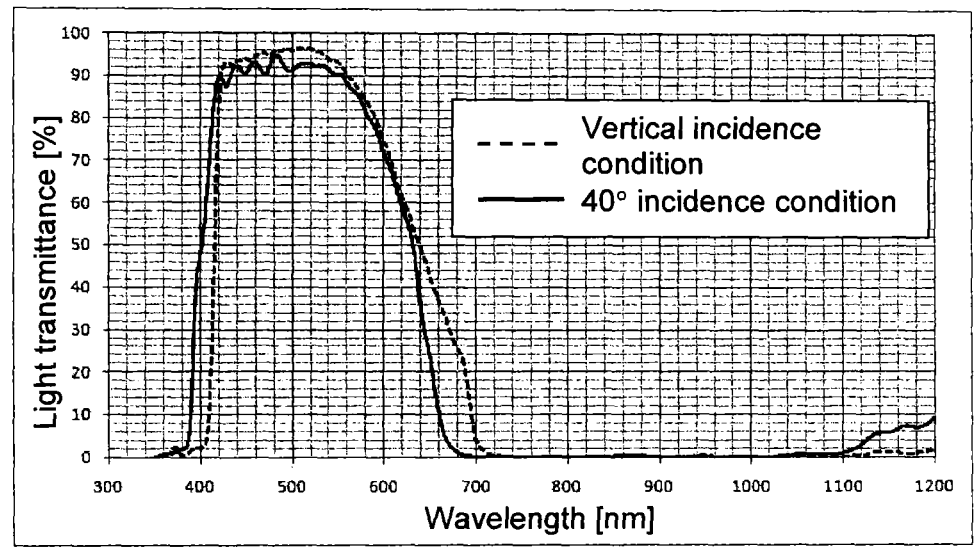
FIG. 9 is a graph showing the light transmittance characteristics at incidence angles of 0° and 40° of the near infrared cutoff filter in Example 6.

FIG. 9 shows the measured values of the spectral characteristics of the near infrared cutoff filter in Example 6. In FIG. 9, the ordinate represents the transmittance, and the abscissa represents the wavelength. FIG. 9 shows the measured values under vertical (0°) incidence condition and under 40° incidence condition.

From the measured values, the average transmittances in the wavelength bands of regions R, G and B under vertical incidence condition, the average transmittances in the wavelength bands of regions R, G and B under 40° incidence condition, and the minimum values in the wavelength bands of regions G and B under 40° incidence condition, were obtained.

Further, from the average transmittances in the respective regions, the decrease rates in average transmittance between under 0° incidence condition and under 40° incidence condition, were obtained, and the difference between the maximum value and the minimum value thereof was calculated. These results are shown in Table 10.

In the repeatedly-laminated layered film construction in Table 7, the film layer number 1 ($Al_2O_3+ZrO_2$: 16.4 nm) is a layer to improve the adhesion between the infrared reflective layer and the substrate. Therefore, the infrared reflective layer is constituted by film layer numbers 2 to 39. Here, the film layer number 1 is one which does not function as an infrared reflective layer.

Example 7

In Example 7, a near infrared cutoff filter was prepared by using the same substrate as in Example 1 and forming, on the front side of this substrate, an infrared reflective layer constituted by a layered film having a high refractive index film H ($TiO_2$) and a low refractive index film L ($SiO_2$) alternately repeatedly laminated, and forming, on the rear side of the substrate, the same antireflection film (AR) composed of six layers as in Example 1, and the spectral characteristics were measured.

Here, as the refractive index of $TiO_2$, 2.368 was used, as the refractive index of $SiO_2$, 1.456 was used, as the refractive index of $Al_2O_3+ZrO_2$ (a composite oxide film of alumina and zirconium oxide), 1.663 was used, and further, as the refractive index of $MgF_2$, 1.424 was used.

Figure 10:
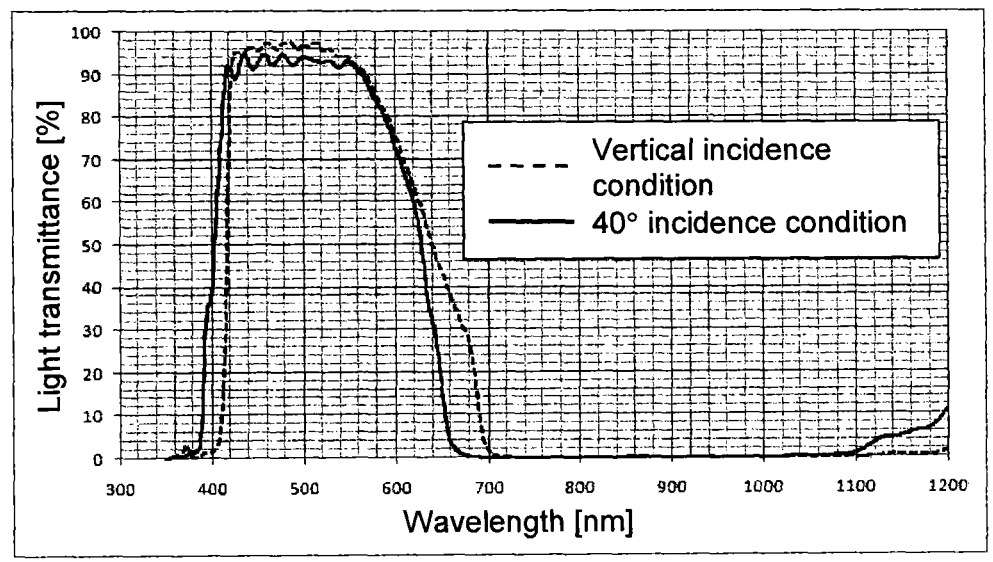
FIG. 10 is a graph showing the light transmittance characteristics at incidence angles of 0° and 40° of the near infrared cutoff filter in Example 7.

FIG. 10 shows the measured values of the spectral characteristics of the near infrared cutoff filter in Example 7. In FIG. 10, the ordinate represents the transmittance, and the abscissa represents the wavelength. FIG. 10 shows the measured values under vertical (0°) incidence condition and under 40° incidence condition.

From the measured values, the average transmittances in the wavelength bands of regions R, G and B under vertical incidence condition, the average transmittances in the wavelength bands of regions R, G and B under 40° incidence condition, and the minimum values in the wavelength bands of regions G and B under 40° incidence condition, were obtained.

Further, from the average transmittances in the respective regions, the decrease rates in average transmittance between under 0° incidence condition and under 40° incidence condition, were obtained, and the difference between the maximum value and the minimum value thereof was calculated. These results are shown in Table 10.

The film layer numbers 1 and 2 of the infrared reflective layer, and the antireflection film were formed by means of a heating vapor deposition device, and the film layer numbers 3 to 40 of the infrared reflective layer were formed by means of IAD (ion-assisted vapor deposition method).

In the repeatedly-laminated layered film construction in Table 8, the film layer number 1 ($Al_2O_3+ZrO_2$: 10 nm) and the film layer number 2 ($MgF_2$: 70 nm) are layers to improve the adhesion between the infrared reflective layer and the substrate. Therefore, the infrared reflective layer is constituted by film layer numbers 3 to 40. Here, the film layer number 1 and the film layer number 2 are ones which do not function as infrared reflective layers.

The repeatedly-laminated layered film construction of the infrared reflective layer in Example 7 is shown in Table 8.

TABLE 8

| Film layer number | Film material | Film thickness [nm] |
|---|---|---|
| 1 | $Al_2O_3 + ZrO_2$ | 10 |
| 2 | $MgF_2$ | 70 |
| 3 | $TiO_2$ | 12.87 |
| 4 | $SiO_2$ | 48.52 |
| 5 | $TiO_2$ | 117.05 |
| 6 | $SiO_2$ | 190.08 |
| 7 | $TiO_2$ | 114.19 |
| 8 | $SiO_2$ | 193.94 |
| 9 | $TiO_2$ | 114.78 |
| 10 | $SiO_2$ | 195 |
| 11 | $TiO_2$ | 115.57 |
| 12 | $SiO_2$ | 192.54 |
| 13 | $TiO_2$ | 114.63 |
| 14 | $SiO_2$ | 187.59 |
| 15 | $TiO_2$ | 102.66 |
| 16 | $SiO_2$ | 162.97 |
| 17 | $TiO_2$ | 99.38 |
| 18 | $SiO_2$ | 182.37 |
| 19 | $TiO_2$ | 105.51 |
| 20 | $SiO_2$ | 162.95 |
| 21 | $TiO_2$ | 88.44 |
| 22 | $SiO_2$ | 149.59 |
| 23 | $TiO_2$ | 82.09 |
| 24 | $SiO_2$ | 143.06 |
| 25 | $TiO_2$ | 80.95 |
| 26 | $SiO_2$ | 142.29 |
| 27 | $TiO_2$ | 80.15 |
| 28 | $SiO_2$ | 141.59 |
| 29 | $TiO_2$ | 81.06 |
| 30 | $SiO_2$ | 140.27 |
| 31 | $TiO_2$ | 80.99 |
| 32 | $SiO_2$ | 140.51 |
| 33 | $TiO_2$ | 81.59 |
| 34 | $SiO_2$ | 141.33 |
| 35 | $TiO_2$ | 81.5 |
| 36 | $SiO_2$ | 144.51 |
| 37 | $TiO_2$ | 83.53 |
| 38 | $SiO_2$ | 148.52 |
| 39 | $TiO_2$ | 82.85 |
| 40 | $SiO_2$ | 75.27 |

Comparative Example 1

In Comparative Example 1, a near infrared cutoff filter was prepared by using the same substrate as in Example 1 and forming, on the front side of this substrate, an infrared reflective layer constituted by a layered film having a high refractive index film H ($TiO_2$) and a low refractive index film L ($SiO_2$) alternately repeatedly laminated, and forming, on the rear side of the substrate, the same antireflection film (AR) composed of six layers as in Example 1. With respect to the obtained near infrared cutoff filter, the spectral characteristics were simulated.

Here, as the refractive index of $TiO_2$, 2.361 was used, and as the refractive index of $SiO_2$, 1.465 was used.

The repeatedly-laminated layered film construction of the infrared reflective layer in Comparative Example 1 is shown in Table 9.

TABLE 9

| Film layer number | Film material | Film thickness [nm] |
|---|---|---|
| 1 | $TiO_2$ | 12.84 |
| 2 | $SiO_2$ | 36.66 |
| 3 | $TiO_2$ | 121.75 |
| 4 | $SiO_2$ | 185.25 |
| 5 | $TiO_2$ | 116.83 |
| 6 | $SiO_2$ | 189.68 |
| 7 | $TiO_2$ | 119.96 |
| 8 | $SiO_2$ | 192.51 |
| 9 | $TiO_2$ | 118.33 |
| 10 | $SiO_2$ | 193.19 |
| 11 | $TiO_2$ | 119.83 |
| 12 | $SiO_2$ | 191.13 |
| 13 | $TiO_2$ | 119.01 |
| 14 | $SiO_2$ | 192.57 |
| 15 | $TiO_2$ | 118.84 |
| 16 | $SiO_2$ | 188.06 |
| 17 | $TiO_2$ | 118.15 |
| 18 | $SiO_2$ | 182.03 |
| 19 | $TiO_2$ | 106 |
| 20 | $SiO_2$ | 162.13 |
| 21 | $TiO_2$ | 103.67 |
| 22 | $SiO_2$ | 174.3 |
| 23 | $TiO_2$ | 112.06 |
| 24 | $SiO_2$ | 174.07 |
| 25 | $TiO_2$ | 102.19 |
| 26 | $SiO_2$ | 159.1 |
| 27 | $TiO_2$ | 100.68 |
| 28 | $SiO_2$ | 171.74 |
| 29 | $TiO_2$ | 109.79 |
| 30 | $SiO_2$ | 170.75 |
| 31 | $TiO_2$ | 95.78 |
| 32 | $SiO_2$ | 146.85 |
| 33 | $TiO_2$ | 88.82 |
| 34 | $SiO_2$ | 144.46 |
| 35 | $TiO_2$ | 85.66 |

TABLE 9-continued

| Film layer number | Film material | Film thickness [nm] |
|---|---|---|
| 36 | $SiO_2$ | 143.26 |
| 37 | $TiO_2$ | 84.67 |
| 38 | $SiO_2$ | 141.95 |
| 39 | $TiO_2$ | 84.11 |
| 40 | $SiO_2$ | 143.1 |
| 41 | $TiO_2$ | 84.25 |
| 42 | $SiO_2$ | 142.45 |
| 43 | $TiO_2$ | 84.81 |
| 44 | $SiO_2$ | 143.23 |
| 45 | $TiO_2$ | 85.06 |
| 46 | $SiO_2$ | 146.13 |
| 47 | $TiO_2$ | 88.14 |
| 48 | $SiO_2$ | 149.64 |
| 49 | $TiO_2$ | 88.15 |
| 50 | $SiO_2$ | 72.46 |

Figure 11:
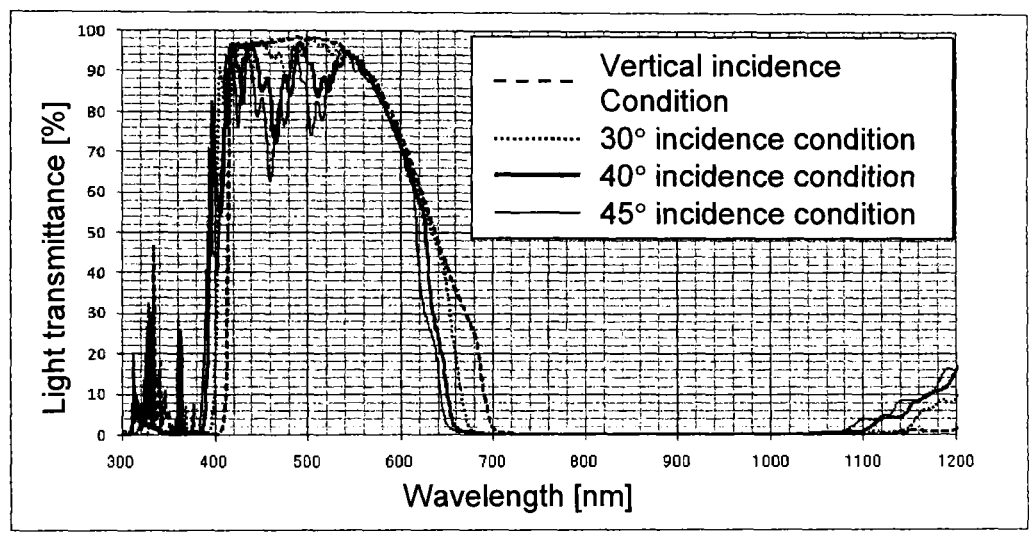
FIG. 11 is a graph showing the light transmittance characteristics at incidence angles of 0°, 30°, 40° and 45° of the near infrared cutoff filter in Comparative Example 1.

FIG. 11 shows the simulation results of the spectral characteristics of the near infrared cutoff filter in Comparative Example 1. In FIG. 11, the ordinate represents the transmittance, and the abscissa represents the wavelength. FIG. 11 shows the simulation results under vertical (0°) incidence condition, under 30° incidence condition, under 40° incidence condition and under 45° incidence condition.

From the simulation results, the average transmittances in the wavelength bands of regions R, G and B under vertical incidence condition, the average transmittances in the wavelength bands of regions R, G and B under 40° and 45° incidence conditions, and the minimum values in the wavelength bands of regions G and B under 40° incidence condition, were obtained.

Further, from the average transmittances in the respective regions, the decrease rates in average transmittance between under 0° incidence condition and under 40° incidence condition, were obtained, and the difference between the maximum value and the minimum value thereof was calculated.

Further, from the average transmittances in the respective regions, the decrease rates in average transmittance between under 0° incidence condition and under 45° incidence condition, were obtained.

These results are shown in Table 10. In Table 10, "–" means "not measured".

TABLE 10

| | | Ex. 1 | Ex. 2 | Ex. 3 | Ex. 4 | Ex. 5 | Ex. 6 | Ex. 7 | Comp. Ex. 1 |
|---|---|---|---|---|---|---|---|---|---|
| T(R0) [%] | Region R, average transmittance under 0° incidence condition | 68.63 | 68.92 | 87.57 | 68.63 | 68.56 | 68.25 | 70.02 | 68.88 |
| T(R40) [%] | Region R, average transmittance under 40° incidence condition | 65.55 | 65.90 | 84.66 | 65.32 | 65.34 | 65.90 | 67.00 | 65.45 |
| T(G0) [%] | Region G, average transmittance under 0° incidence condition | 95.99 | 96.55 | 98.26 | 95.86 | 95.86 | 94.65 | 95.15 | 96.36 |
| T(G40) [%] | Region G, average transmittance under 40° incidence condition | 92.18 | 92.93 | 95.91 | 91.52 | 93.55 | 91.56 | 92.67 | 90.24 |
| T(G45) [%] | Region G, average transmittance under 45° incidence condition | 89.79 | 90.27 | 94.13 | 88.77 | 91.71 | — | — | 87.35 |
| T(B0) [%] | Region B, average transmittance under 0° incidence condition | 97.72 | 97.62 | 98.58 | 97.35 | 97.23 | 94.23 | 96.34 | 97.43 |
| T(B40) [%] | Region B, average transmittance under 40° incidence condition | 94.49 | 94.15 | 96.71 | 94.13 | 95.47 | 91.69 | 93.06 | 85.53 |
| T(B45) [%] | Region B, average transmittance under 45° incidence condition | 90.31 | 91.49 | 94.32 | 90.20 | 91.67 | — | — | 82.08 |
| (T(R0)-T(R40))/T(R0) | Decrease rate of region R (under 40° incidence condition) | 0.045 | 0.044 | 0.033 | 0.048 | 0.047 | 0.034 | 0.043 | 0.050 |
| (T(G0)-T(G40))/T(G0) | Decrease rate of region G (under 40° incidence condition) | 0.040 | 0.037 | 0.024 | 0.045 | 0.024 | 0.033 | 0.026 | 0.064 |

TABLE 10-continued

|  |  | Ex. 1 | Ex. 2 | Ex. 3 | Ex. 4 | Ex. 5 | Ex. 6 | Ex. 7 | Comp. Ex. 1 |
|---|---|---|---|---|---|---|---|---|---|
| (T(B0)-T(B40))/T(B0) | Decrease rate of region B (under 40° incidence condition) | 0.033 | 0.036 | 0.019 | 0.033 | 0.018 | 0.027 | 0.034 | 0.122 |
| Difference between maximum value and minimum value of decrease rate | Under 40° incidence condition | 0.012 | 0.008 | 0.014 | 0.015 | 0.029 | 0.008 | 0.017 | 0.072 |
| (T(G0)-T(G45))/T(G0) | Decrease rate of region G (under 45° incidence condition) | 0.065 | 0.064 | 0.042 | 0.074 | 0.043 | — | — | 0.095 |
| (T(B0)-T(B45))/T(B0) | Decrease rate of region B (under 45° incidence condition) | 0.069 | 0.068 | 0.040 | 0.070 | 0.046 | — | — | 0.202 |
| MIN(G40) [%] | Region G, minimum value in transmittance under 40° incidence condition | 88.07 | 88.07 | 95.02 | 88.00 | 89.38 | 88.35 | 90.78 | 83.44 |
| MIN(B40) [/0] | Region B, minimum value in transmittance under 40° incidence condition | 92.79 | 92.79 | 95.37 | 93.22 | 93.18 | 90.00 | 91.11 | 71.92 |

From the results in Table 10, it is evident that with respect to each near infrared cutoff filter in each Example, each of the decrease rates in light transmittance in regions R, G and B as between a case where light has entered at an incidence angle of 0° and a case where light has entered at an incidence angle of 40°, is at most 0.05, and the difference between the maximum value and the minimum value among these decrease rates, is also at most 0.04. Therefore, in a case where light has entered at an angle of 40°, as compared with a case where light has entered at an angle of 0°, the decrease rate in transmittance would not become specifically low in any one region among regions R, G and B, and therefore, it is possible to suppress an influence to the color tone of a captured image.

Whereas, in the case of the near infrared cutoff filter in Comparative Example 1, each of the decrease rates in light transmittance in regions R, G and B as between a case where light has entered at an incidence angle of 0° and a case where light has entered at an incidence angle of 40° exceeds 0.05, and the difference between the maximum value and the minimum value among these decrease rates, is also large at a level of 0.072. Especially, the decrease rate in light transmittance in region B is 0.122, which is large as compared with the decrease rates in regions R and G. Therefore, in a case where light has entered at an incidence angle of 40°, as compared with a case where light has entered at an incidence angle of 0°, light with blue color wavelengths decreases, and the color tone of a captured image is likely to be substantially changed.

Further, in the near infrared cutoff filter in Comparative Example 1, the light transmittance characteristics under 30° incidence condition, are as follows. The decrease rate in region R was 0.024, the decrease rate in region G was 0.016, the decrease rate in region B was 0.038, and the difference between the maximum value and the minimum value among the decrease rates was 0.022. Thus, it can be said that there is no substantial difference between the light transmittance characteristics under 30° incidence condition in the near infrared cutoff filter in Comparative Example 1 and the light transmittance characteristics under 40° incidence condition in the near infrared cutoff filter in each Example.

That is, the near infrared cutoff filter of the present invention is able to attain the light transmittance characteristics under 30° incidence condition of the conventional near infrared cutoff filter, under 40° incidence condition, and thus is considered to be one excellent in the oblique incident light characteristics.

From the results in Table 10, it is evident that with respect to each near infrared cutoff filter in each of Examples 1 to 5, each of the decrease rates in light transmittance in regions G and B as between a case where light has entered at an incidence angle of 0° and a case where light has entered at an incidence angle of 45°, is at most 0.09. Therefore, in a case where light has entered at an incidence angle of 45°, as compared with a case where light has entered at an incidence angle of 0°, the decrease rate in either one of regions G and B would not become low, and therefore, it is possible to suppress an influence to the color tone of a captured image.

Whereas, with respect to the near infrared cutoff filter in Comparative Example 1, each of the decrease rates in light transmittance in regions G and B as between a case where light has entered at an incidence angle of 0° and a case where light has entered at an incidence angle of 45°, exceeds 0.09. Especially, the decrease rate in light transmittance in region B is as large as 0.202, and the difference in the decrease rate is substantial as compared with region G. Therefore, in a case where light has entered at an incidence angle of 45°, as compared with a case where light has entered at an incidence angle of 0°, light with blue color wavelengths decreases, and the color tone of a captured image is likely to be substantially changed.

INDUSTRIAL APPLICABILITY

The near infrared cutoff filter of the present invention is capable of suppressing an influence to a captured image when the incidence angle of light is large. Therefore, it is useful as a near infrared cutoff filter for a solid state imaging sensor (such as CCD image sensor or CMOS image sensor) for digital cameras or digital videos.

This application is a continuation of PCT Application No. PCT/JP2013/085274, filed on Month Day, 2013, which is based upon and claims the benefit of priority from Japanese Patent Application No. 2012-287084 filed on Dec. 28, 2012. The contents of those applications are incorporated herein by reference in their entireties.

REFERENCE SYMBOLS 10, 10A, 20A, 30A: near infrared cutoff filter, 11, 21, 31: transparent substrate, 12, 22, 32: optical multilayer film, 100: imaging device, 110: solid imaging sensor, 120: cover glass, 130: lens assembly, 140: near infrared cutoff filter, 150: package, L1 to L4: lenses

What is claimed is:

1. A near infrared cutoff filter, comprising a substrate to transmit at least light in the visible wavelength region and, on at least one side of the substrate, an infrared reflective layer constituted by a layered film comprising a high refractive index film H and a low refractive index film L repeatedly laminated, wherein the near infrared cutoff filter has light transmittance characteristics such that when the decrease rates in average transmittance in region R, region G and region B are calculated by the following formulae (1) to (3), respectively, the difference between the maximum value and the minimum value among them is at most 0.04:

$$(T(R0)-T(R40))/T(R0) \quad (1)$$

$$(T(G0)-T(G40))/T(G0) \quad (2)$$

$$(T(B0)-T(B40))/T(B0) \quad (3)$$

wherein
the wavelength band of from 600 to 620 nm is designated as region R, the wavelength band of from 500 to 560 nm is designated as region G, and the wavelength band of from 440 to 480 nm is designated as region B,
the respective average transmittances in regions R, G and B under vertical incidence condition are designated as T(R0), T(G0) and T(B0), respectively, and
the respective average transmittances in regions R, G and B under 40° incidence condition are designated as T(R40), T(G40) and T(B40), respectively.

2. The near infrared cutoff filter according to claim 1, wherein the light transmittance characteristics of the near infrared cutoff filter are such that each of the decrease rates calculated by the formulae (1) to (3) is at most 0.05.

3. The near infrared cutoff filter according to claim 1, wherein the substrate comprises a material to absorb near infrared rays.

4. The near infrared cutoff filter according to claim 1, wherein the infrared reflective layer is at most 50 layers.

5. The near infrared cutoff filter according to claim 1, wherein the light transmittance characteristics of the near infrared cutoff filter are such that each of the minimum values of light transmittances in the wavelength bands in regions G and B under 40° incidence condition is at least 85%.

6. The near infrared cutoff filter according to claim 1, wherein the light transmittance characteristics of the near infrared cutoff filter are such that the light transmittance at a wavelength of 1,200 nm under 40° incidence condition is at most 10%.

7. The near infrared cutoff filter according to claim 1, wherein
the infrared reflective layer comprises a plurality of layered films represented by $(HL)^n$, wherein H is a high refractive index film, L is a low refractive index film, n is a natural number of at least 2, and $^n$ means a structure wherein (HL) is repeated n times, and
the light transmittance characteristics of the plurality of layered films are such that the maximum value of the light transmittance in the wavelength band of from 950 to 1,150 nm under vertical incidence condition is at most 10%.

8. The near infrared cutoff filter according to claim 1, wherein the substrate comprises fluorophosphates glass or phosphate glass.

9. The near infrared cutoff filter according to claim 1, wherein
the high refractive index film comprises, as a constituent material, at least one member selected from the group consisting of $TiO_2$, $Ta_2O_5$, $Nb_2O_5$ and composite oxides thereof,
the intermediate refractive index film comprises, as a constituent material, at least one member selected from the group consisting of $Al_2O_3$, $Y_2O_3$ and composite oxides thereof, and
the low refractive index film comprises, as a constituent material, at least one member selected from the group consisting of $SiO_2$, $MgF_2$ and composite oxides thereof.

10. The near infrared cutoff filter according to claim 1, wherein
the high refractive index film comprises, as a constituent material, at least one member selected from the group consisting of $TiO_2$, $Ta_2O_5$, $Nb_2O_5$ and composite oxides thereof, and
the low refractive index film comprises, as a constituent material, at least one member selected from the group consisting of $SiO_2$, $MgF_2$ and composite oxides thereof.

11. The near infrared cutoff filter according to claim 1, which comprises the infrared reflective layer on the front side of the substrate, and an antireflection film or the infrared reflective layer on the rear side of the substrate.

12. A near infrared cutoff filter, comprising a substrate to transmit at least light in the visible wavelength region and, on at least one side of the substrate, an infrared reflective layer constituted by:
a layered film comprising a high refractive index film H and a low refractive index film L repeatedly laminated,
wherein the low refractive index film L comprises a constituent material having a refractive index at a wavelength of 500 nm smaller than a constituent material for the high refractive index film H; or
a layered film comprising a high refractive index film H, an intermediate refractive index film M and a low refractive index film L' repeatedly laminated,
wherein the intermediate refractive index film M comprises a constituent material having a refractive index at a wavelength of 500 nm smaller than a constituent material for the high refractive index film H, and the low refractive index film L' comprises a constituent material having a refractive index at a wavelength of 500 nm smaller than a constituent material for the intermediate refractive index film M;
wherein the near infrared cutoff filter has light transmittance characteristics such that each of the decrease rates in average transmittance in region G and region B calculated by the following formulae (4) and (5), respectively, is at most 0.09:

$$(T(G0)-T(G45))/T(G0) \quad (4)$$

$$(T(B0)-T(B45))/T(B0) \quad (5)$$

wherein
the wavelength band of from 500 to 560 nm is designated as region G, and the wavelength band of from 440 to 480 nm is designated as region B,
the respective average transmittances in regions G and B under vertical incidence condition are designated as T(G0) and T(B0), respectively, and
the respective average transmittances in regions G and B under 45° incidence condition are designated as T(G45) and T(B45), respectively.

13. The near infrared cutoff filter according to claim 12, wherein the substrate comprises a material to absorb near infrared rays.

14. The near infrared cutoff filter according to claim 12, wherein the infrared reflective layer is at most 50 layers.

15. The near infrared cutoff filter according to claim 12, wherein the light transmittance characteristics of the near infrared cutoff filter are such that each of the minimum values of light transmittances in the wavelength bands in regions G and B under 40° incidence condition is at least 85%.

16. The near infrared cutoff filter according to claim 12, wherein the light transmittance characteristics of the near infrared cutoff filter are such that the light transmittance at a wavelength of 1,200 nm under 40° incidence condition is at most 10%.

17. A near infrared cutoff filter, comprising a substrate to transmit at least light in the visible wavelength region and, on at least one side of the substrate, an infrared reflective layer constituted by a layered film comprising a high refractive index film H and a low refractive index film L repeatedly laminated, and which has light transmittance characteristics such that each of the decrease rates in average transmittance in region G and region B calculated by the following formulae (4) and (5), respectively, is at most 0.09:

$$(T(G0)-T(G45))/T(G0) \qquad (4)$$

$$(T(B0)-T(B45))/T(B0) \qquad (5)$$

wherein the wavelength band of from 500 to 560 nm is designated as region G, and the wavelength band of from 440 to 480 nm is designated as region B, the respective average transmittances in regions G and B under vertical incidence condition are designated as T(G0) and T(B0), respectively, and the respective average transmittances in regions G and B under 45° incidence condition are designated as T(G45) and T(B45), respectively.

* * * * *